United States Patent [19]
Takehashi et al.

[11] Patent Number: 5,640,044
[45] Date of Patent: Jun. 17, 1997

[54] SEMICONDUCTOR DEVICE AND METHOD OF PRODUCING SAID SEMICONDUCTOR DEVICE

[75] Inventors: Shinitsu Takehashi; Kenzo Hatada, both of Osaka, Japan

[73] Assignee: Matsushita Electric Industrial Co., Ltd., Osaka, Japan

[21] Appl. No.: 421,183

[22] Filed: Apr. 13, 1995

[30] Foreign Application Priority Data

Apr. 15, 1994 [JP] Japan .................... 6-077112

[51] Int. Cl.$^6$ .................... H01L 23/495; H01L 23/34
[52] U.S. Cl. .................... 257/666; 257/669; 257/676; 257/724
[58] Field of Search .................... 257/669, 676, 257/723, 724, 666.4, 666

[56] References Cited

U.S. PATENT DOCUMENTS

| | | | |
|---|---|---|---|
| 5,012,323 | 4/1991 | Farnworth | 257/723 |
| 5,084,753 | 1/1992 | Goida et al. | 257/723 |
| 5,126,823 | 6/1992 | Otsuka et al. | 352/70 |
| 5,215,940 | 6/1993 | Orcutt et al. | 437/209 |
| 5,258,330 | 11/1993 | Khandros et al. | 437/209 |
| 5,309,017 | 5/1994 | Maruyama | 257/676 |
| 5,321,204 | 6/1994 | Ko | 257/676 |

FOREIGN PATENT DOCUMENTS

| | | | |
|---|---|---|---|
| 1-272144 | 10/1989 | Japan . | |
| 0155954 | 5/1992 | Japan | 257/666.4 |
| 5-47999 | 2/1993 | Japan . | |
| 5-121462 | 5/1993 | Japan . | |

*Primary Examiner*—Sara W. Crane
*Assistant Examiner*—David Ostrowski
*Attorney, Agent, or Firm*—McDermott, Will & Emery

[57] ABSTRACT

The present invention is premised on a semiconductor device in which one semiconductor chip is mounted on each of both faces of a die pad of a lead frame. The semiconductor chips are disposed such that the projected lines, on the die pad, of the corresponding sides of the semiconductor chips, intersect with each other at an angle of 45°. The tips of inner leads are located in the sides of a virtual octagon formed by outwardly enlarging an octagon formed by connecting, to one another, the apexes of the semiconductor chips. The sides of the virtual octagon are respectively opposite to the sides of the semiconductor chips. The number of the inner leads of which tips are located in each of the sides of the virtual octagon, is the same as the number of bonding pads disposed at each of the sides of the semiconductor chips. The inner leads of which tips are located in each of the sides of the virtual octagon, are connected to the bonding pads at each of the sides of one of the first and second semiconductor chips.

10 Claims, 19 Drawing Sheets

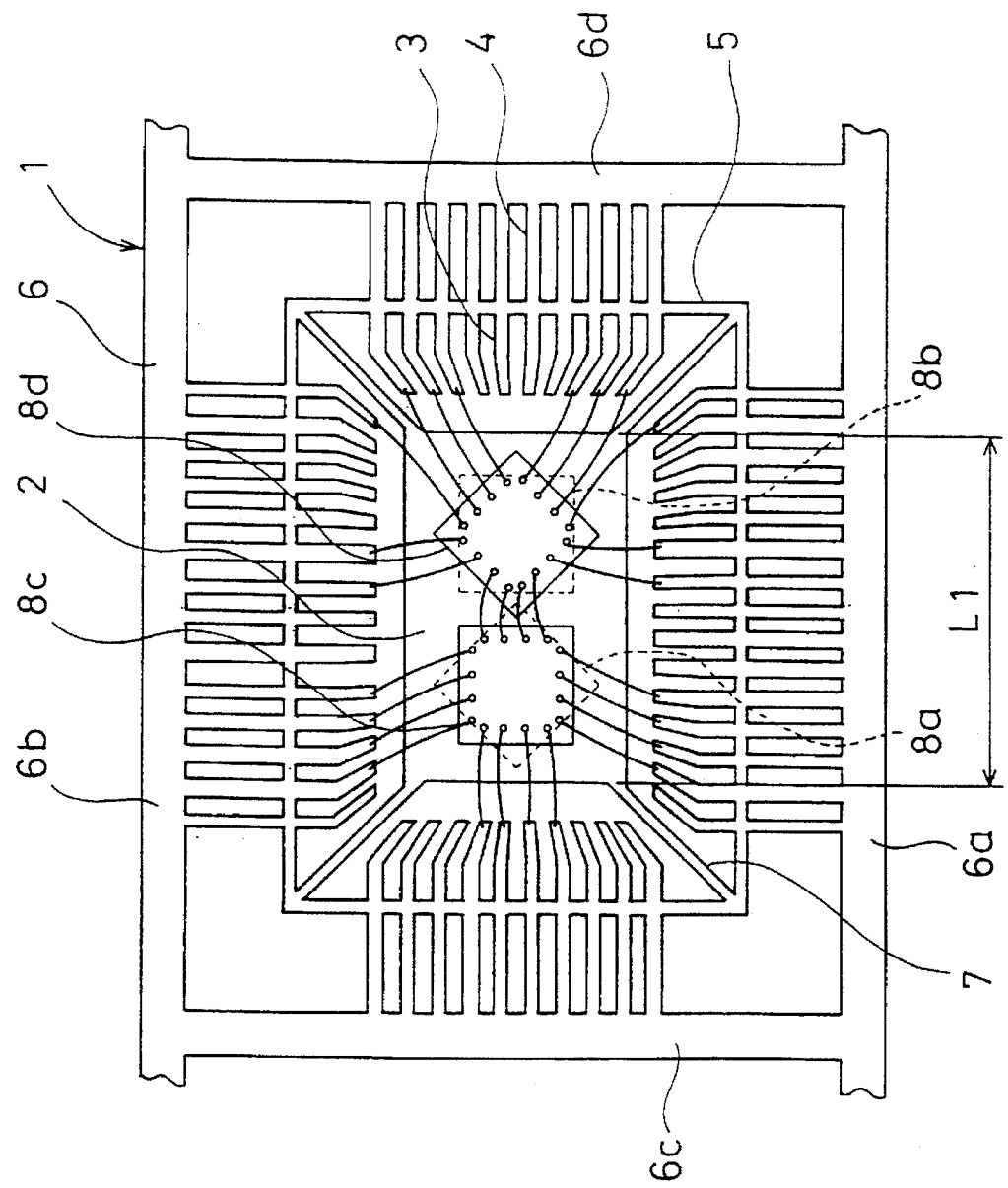

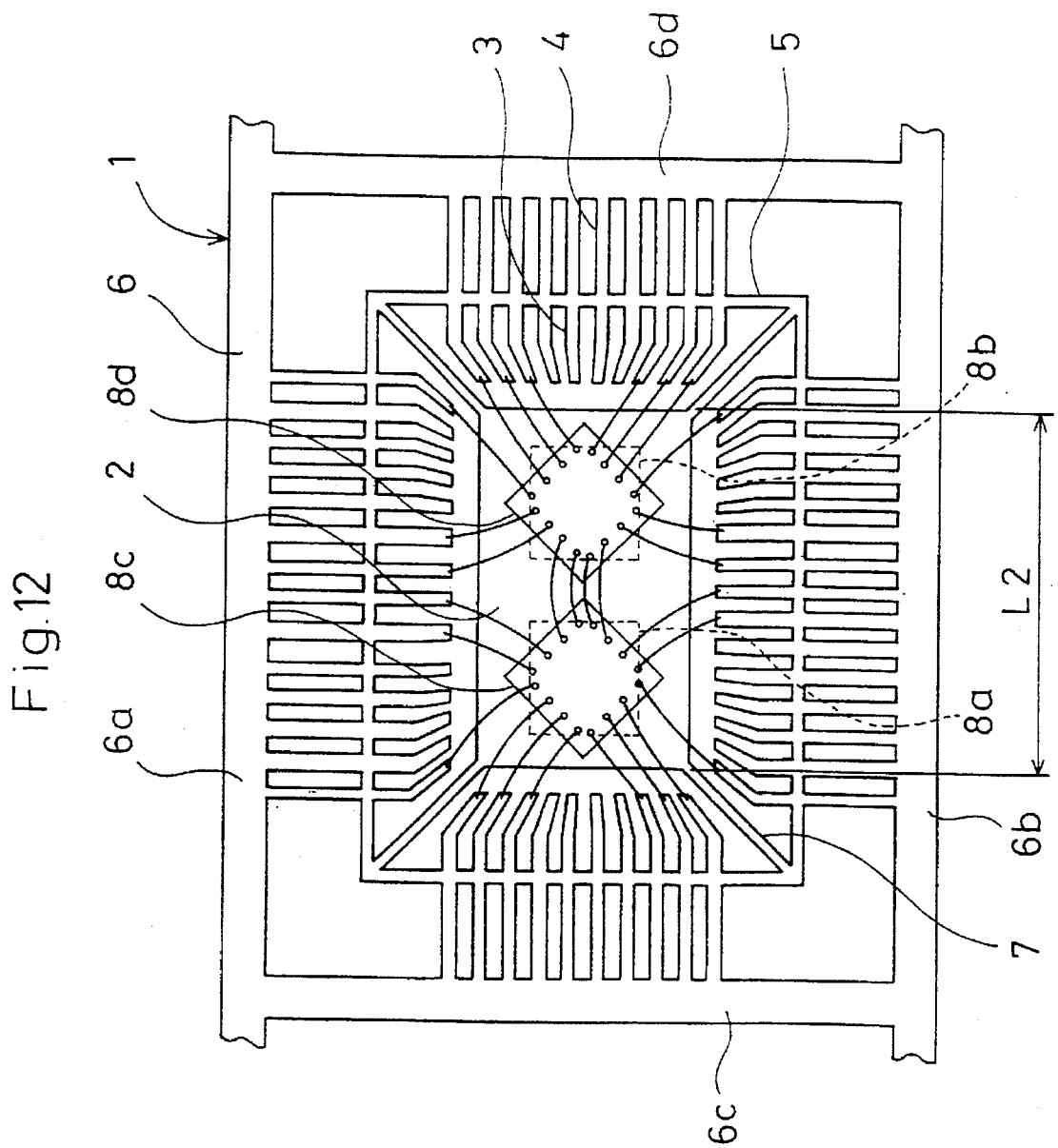

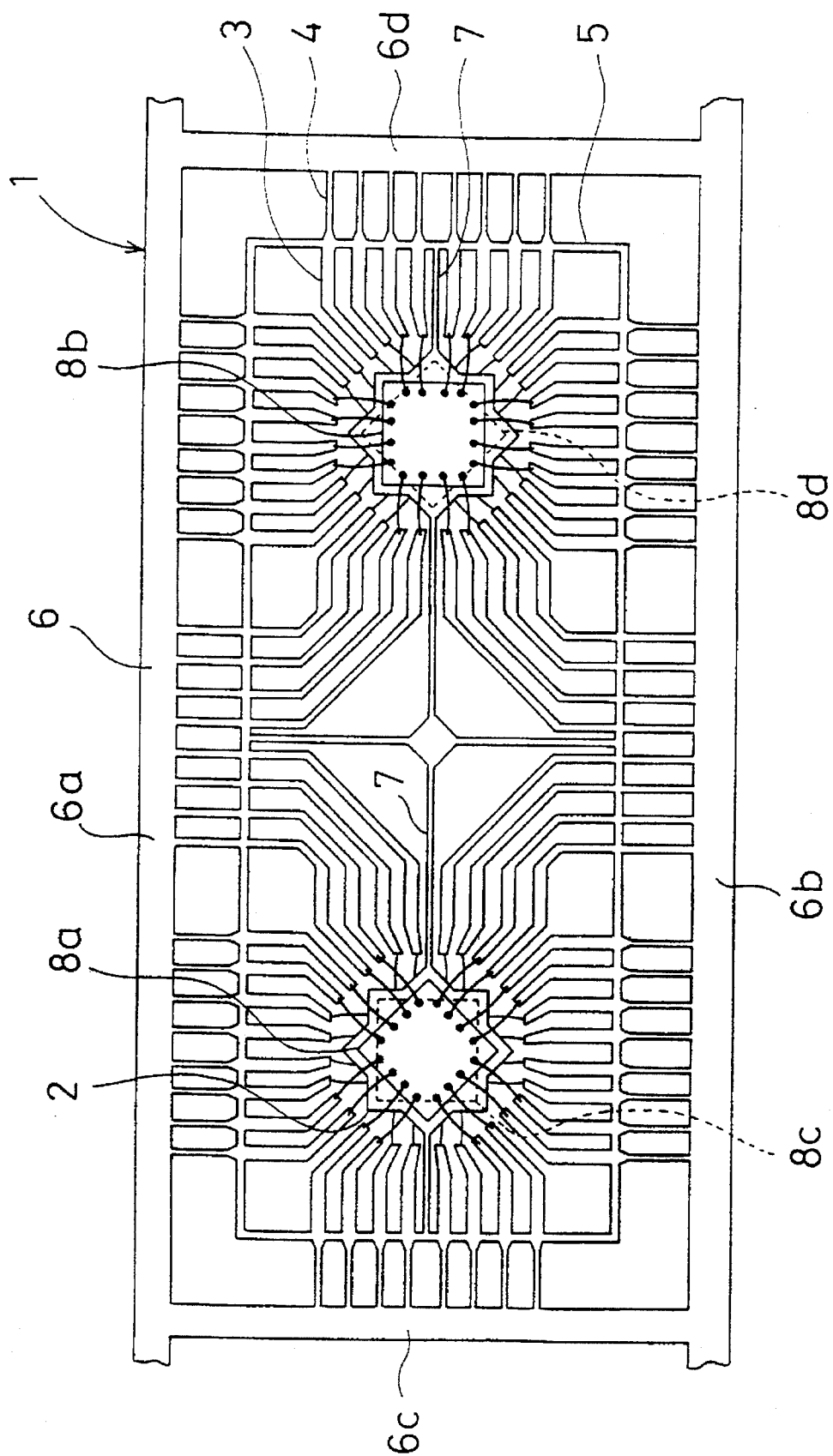

PRIOR ART

SEMICONDUCTOR DEVICE AND METHOD OF PRODUCING SAID SEMICONDUCTOR DEVICE

BACKGROUND OF THE INVENTION

The present invention relates to a semiconductor device to be mounted using a lead frame. More particularly, the present invention relates to a semiconductor device in which semiconductor chips are disposed on both faces of a die pad or the lead frame, and also to a method of producing such a semiconductor device.

In a conventional a semiconductor-device mounting process, a single semiconductor chip is disposed on one face of a die pad of a lead frame made of a material such as a 42-alloy, Cu or the like, the bonding pads of the semiconductor chip and the inner leads of the lead frame are wire-bonded to each other through metallic fine wires made of Au, Al, Cu or the like, and the semiconductor chip, the bonding wires and the lead frame are sealed with an insulating resin to protect the semiconductor chip and the bonding wires from the external environment.

On the other hand, recent electronic machines, in particular, information machines, compact portable terminal machines and the like tend to have more functions and better performance. This increases the number of semiconductor devices to be mounted on an electronic machine. Accordingly, when there are used semiconductor devices each of which is formed by mounting a single semiconductor chip on one lead frame as conventionally done, it is difficult to satisfy the requirements for smaller, lighter and more economical electronic machines.

In this connection, a multi-chip package technology is proposed as one of means for providing smaller and lighter electronic machines without the functions and performance thereof injured. More specifically, a plurality of semiconductor chips are mounted on one semiconductor device, and such a semiconductor device is used to form an electronic machine. This lowers the number of semiconductor devices mounted on an electronic machine, and consequently reduces the total area where the semiconductor devices occupy in the electronic machine. That is, a plurality of semiconductor chips are made in the form of a single package to reduce the number and mounting area of semiconductor devices mounted on an electronic machine. Thus, the electronic machine can be made in a smaller and lighter design, yet assuring the functions and performances required for the electronic machine.

The following description will discuss an example of a currently proposed multi-chip package technology.

A semiconductor device shown in FIG. 14a is formed by technique disclosed in Japanese Patent Laid-Open Publication H5-47999. In this semiconductor device, two lead frames 30a, 30b have die pads 31a, 31b on one faces of which semiconductor chips 32a, 32b are mounted, and the lead frames 30a, 30b are laminated to each other through an insulating film 33 and sealed with resins 29, thus forming a multi-chip package. FIG. 15 shows the process of producing this semiconductor device. As shown in FIG. 15, one semiconductor chip (not shown) is mounted on one face of the die pad 31a of one lead frame 30a, and then the semiconductor chip and that face of the lead frame 30a on which the semiconductor chip has been mounted, are sealed with the resin by transfer molding. Likewise, a semiconductor chip (not shown) is mounted on one face of the die pad 31b of the other lead frame 30b, and then the semiconductor chip and that face of the lead frame 30b on which the semiconductor chip has been mounted, are sealed with the resin by transfer molding. These two lead frames 30a, 30b of which only one faces have been sealed with resins, are laminated to each other through the insulating film 33. In the following description, such a semiconductor device is called a semiconductor device having a multi-layer lead frame.

A semiconductor device shown in FIG. 14b, is formed by technique disclosed in Japanese Patent Laid-Open Publications H1-272144 or H5-121462. In this semiconductor device, two semiconductor chips 32a, 32b are disposed on both faces of a die pad 31 of one lead frame 30 through adhesive layers 34a, 34b made of conductive adhesives or the like, thus forming a multi-chip package. FIG. 16 shows the process of producing this semiconductor device. As shown in FIG. 16a, one semiconductor chip 32a is mounted on one face of the die pad 31 of the lead frame 30 and then subjected to wire-bonding. As shown in FIG. 16b, the semiconductor chip 32a is sealed with resin 35a in one transfer molding die 39. As shown in FIGS. 16c, 16d, the semiconductor chip 32b is disposed on the other face of the lead frame 30, and then sealed with resin 40 in another transfer molding die 39. In the following description, such a semiconductor device is called a semiconductor device having a single-layer lead frame.

The following description will discuss the advantages and disadvantages of the conventional semiconductor device using a multi-layer lead frame as shown in FIG. 14a and the conventional semiconductor device using a single-layer lead frame as shown in FIG. 14b.

The semiconductor device having a multi-layer lead frame in FIG. 14a has the arrangement that two lead frames on which semiconductor chips are mounted, are laminated to each other. Accordingly, one semiconductor device requires two lead frames. This additionally requires the material cost, processing cost and the like of the lead frame and the insulating film. Further, there are required a process of and facilities for laminating the lead frames, thus also increasing the production cost. When only one faces of the lead frames are sealed with resins as shown in FIG. 15, the other faces of the lead frames opposite to the resin-sealed faces, are exposed. To increase the yield of lamination of two lead frames to be conducted at a later step, it is required to design and machine transfer molding dies with high precision such that no sealing resins seep out to prevent resin burrs from sticking to the exposed lead frame faces. This increases the transfer molding dies in cost.

In a semiconductor device having a single-layer lead frame, the number of the member and the number of production steps are reduced and the molding dies may not be so precise as compared with the semiconductor device having a multi-layer lead frame. Thus, the production cost is cheaper. As shown in FIG. 16, however, at least two sets of transfer molding dies and at least two sets of sealing devices are required in the transfer molding steps for distinguishing the obverse of the package from the reverse thereof. This increases the installation cost. Further, when changing the kind of semiconductor device in the production line, transfer molding dies should be replaced twice. It is therefore difficult to flexibly comply with the production of many kinds each in a small quantity.

As thus discussed, there are advantages and disadvantages in the semiconductor device having a single-layer lead frame and the semiconductor device having a multi-layer lead frame. The following description will discuss the common problems in the both types.

In Japanese Patent Laid-Open Publication H1-272144 above-mentioned, FIG. 7 and FIG. 7x show the arrangement of a semiconductor device having a multi-layer lead frame in which the inner leads of the lead frames are wire-bonded to the bonding pads of the semiconductor chips. In such an arrangement, however, if the semiconductor chips are different in operational frequency and voltage, there occurs crosstalk of electric signals among the inner leads. This involves the likelihood that the semiconductor device is considerably lowered in characteristics. Further, it is not easy to take out two signals, as separated from each other, from outer leads of two laminated lead frames.

In such a case, it is required to employ a connection method as shown in FIG. 5 of Japanese Patent Laid-Open Publication H1-272144. FIGS. 17a and 17b attached to the present application illustrate a connection method equivalent to that in FIG. 5 of the laid-open publication above-mentioned, which connection method is applied to a semiconductor device having two semiconductor chips each mounted on each of both faces of a die pad. FIG. 17a is a perspective view illustrating how to wire-bond the bonding pads of semiconductor chips 32a, 32b and inner leads 37 of a lead frame 30 in a semiconductor device having a single layer lead frame. FIG. 17b is a plan view illustrating the arrangement of the electrodes of outer leads of the semiconductor device which is sealed with resin. In FIG. 17a, inner leads 37a1 to 37a8 are connected to the bonding pads of the first semiconductor chip 32a disposed at the obverse face in FIG. 17a through bonding wires, and inner leads 37b1 to 37b8 are connected to the bonding pads of the second semiconductor chip 32b disposed at the reverse face in FIG. 17a through bonding wires 36. As shown in FIG. 17a, the adjacent inner leads are alternately connected to the bonding pads of the first semiconductor chip 32a and the bonding pads of the second semiconductor chip 32b. Accordingly, as shown in FIG. 17b, a semiconductor device 29 sealed with resin is arranged such that outer lead terminals 38a1 to 38a8 connected to the first semiconductor chip 32a and outer lead terminals 38b1 to 38b8 connected to the second semiconductor chip 32b are alternately disposed.

In a semiconductor device having a single-layer lead frame, as disclosed in FIG. 5 of Japanese Patent Laid-Open Publication H1-272144, the adjacent inner leads are alternately connected to the bonding pads of the obverse and reverse semiconductor chips. Such an arrangement is inevitably adopted for the following reasons. In a semiconductor device having a large number of inner leads and a large number of bonding pads of semiconductor chips, it is required to dispose the inner leads and the bonding pads such that they are in close proximity to one another substantially in the entire area of each of the sides of the semiconductor chips. For example, if, in FIG. 5 of the publication above-mentioned, three adjacent inner leads are connected to bonding pads of the same semiconductor chip, the lengths of the bonding wires become excessively long. Accordingly, the bonding wires greatly flow due to the pressure given by resin flow at a transfer molding step or the like (a so-called "wire flow" takes place). This involves the likelihood that the bonding wires come in contact with one another, that the bonding wires and the semiconductor chips come in contact with each other and that bonding wires are disconnected.

However, when the adjacent inner leads are alternately connected to two semiconductor chips as conventionally done, the distance between adjacent inner leads is as narrow as 120 to 250 μm. When the semiconductor chips 32a, 32b are different in operational frequency and voltage, crosstalk of electric signals occurs among adjacent inner leads because the adjacent inner leads are connected to different semiconductor chips, respectively. This involves the likelihood that the semiconductor device is remarkably lowered in characteristics. Further, the conventional arrangement above-mentioned is still disadvantageous in that the bonding wires become uneven in length and that some bonding wires are inevitably excessively long. In particular, when the number of lead frames is increased, the distance between bonding wires at each frame corner is small. Accordingly, when a so-called wire flow occurs at the transfer molding step, there is a high probability that the bonding wires come in contact with one another.

Thus, not only a semiconductor device having a multi-layer lead frame, but also a semiconductor device having a single-layer lead frame are possibly lowered in characteristics. Further, local reduction in distance between bonding wires or a presence of some excessively long bonding wires possibly lowers the production yield and reliability of semiconductor devices.

The following description will discuss another problem. A semiconductor device having a single-layer lead frame is produced in a manner as shown in FIGS. 18a and 18b. That is, after a wire-bonding step is conducted on a first semiconductor chip 32a mounted on one face of a die pad 31, a lead frame 30 is turned over and a wire-bonding step is conducted on a second semiconductor chip 32b mounted on the other face of the die pad 31. At this time, there is a possibility that the bonding wires 36 already disposed at the reverse face, come in contact and interfere with a part of a heating/supporting stand 42 for supporting and heating the lead frame 30. When such an interference occurs, the already disposed bonding wires 36 may be cut or deformed to lower the semiconductor device in reliability. The lead frame is machined such that each distance between adjacent inner leads is generally as fine as hundreds μm. Accordingly, it is extremely difficult to hold a specific inner lead and to make a highly precise heating/supporting stand 42 for providing a space such that already bonded wires do not come in contact and interfere with the heating/supporting stand 42. Consequently, the installation cost is remarkably increased in order to satisfy the requirements above-mentioned.

The following description will discuss a further problem regarding the shape of each inner lead. Generally, there are present, as the electrodes of a semiconductor chip, electrodes for receiving and supplying a signal and power electrodes for supplying an electric power to semiconductor chips. In a semiconductor chip in which power consumption is relatively large, there are instances where a plurality of high- or low-potential electrodes of the power electrodes are connected to a common inner lead in order to prevent bonding wires from being disconnected due to fusing to achieve a high-speed operation of the semiconductor chip. In a conventional lead frame, however, the connection is made as shown in FIG. 19. That is, the number of bonding wires which can be connected to one inner lead is limited. Further, when intended to connect a plurality of bonding pads disposed at positions remote from one another, to one inner lead through bonding wires, these bonding wires inevitably cross other bonding wires. Thus, these intersecting bonding wires may possibly come in contact with one another.

SUMMARY OF THE INVENTION

It is a first object of the present invention to provide (i) a semiconductor device in which semiconductor chips are mounted on both faces of a lead frame, yet not only preventing the distance between adjacent bonding wires at the corners of the semiconductor chips from being narrowed, but also preventing the lengths of such bonding wires from being locally excessively long, and (ii) a method of producing such a semiconductor device.

It is a second object of the present invention to provide a semiconductor device having a lead frame in which a common inner lead can be connected, with bonding wires, to a large number of bonding pads or a plurality of bonding pads disposed at positions remote from one another without the bonding wires intersecting one another.

It is a third object of the present invention to provide, in a process of producing a semiconductor device in which semiconductor chips are mounted on both faces of a die pad of one lead frame, a method capable of avoiding the interference of a heating/supporting stand used at a wire-bonding step, with bonding wires or a semiconductor chip.

To achieve the first object, the present invention provides a first semiconductor device comprising: a lead frame having a die pad, a plurality of inner leads of which tips are disposed in the vicinity of the die pad and which extend toward the die pad, and outer leads respectively extending from the inner leads; a first semiconductor chip mounted on a first face of the die pad of the lead frame and having a polygonal flat shape; a second semiconductor chip mounted on a second face of the die pad of the lead frame and having a polygonal flat shape in which the number of the sides is the same as that of the first semiconductor chip; a plurality of bonding pads disposed at each of the sides of each of the first and second semiconductor chips; and bonding wires connecting the inner leads to the bonding pads. The first and second semiconductor chips are disposed such that the projected lines, on the die pad, of the corresponding sides of the polygons forming the first and second semiconductor chips, intersect with each other at a predetermined angle.

According to the first semiconductor device having the arrangement above-mentioned, the positions of the sides of the first semiconductor chip are angularly shifted with respect to the positions of the sides of the second semiconductor chip. This makes substantially uniform the distances between the adjacent bonding wires which connect the inner leads to the bonding pads at the sides of the semiconductor chips. This effectively prevents the distances between the bonding wires at the corners of the semiconductor chips from being narrowed.

The following arrangement may be added to the first semiconductor device above-mentioned.

The tips of the inner leads are located in the sides of a virtual polygon formed by outwardly enlarging a polygon formed by connecting the apexes of the semiconductor chips to one another, the sides of the virtual polygon respectively face to the sides of the semiconductor chips, and the number of the inner leads of which tips are located in each of the sides of the virtual polygon, is the same as the number of the bonding pads disposed at each of the sides of the semiconductor chips which face to the sides of the virtual polygon.

According to the arrangement above-mentioned, the distances between the bonding wires can further be uniformed.

The inner leads of which tips are located in each of the sides of the virtual polygon, may be connected to the bonding pads at each of the sides of one of the first and second semiconductor chip, and the inner leads of which tips are located in adjacent two sides of the virtual polygon, may respectively be connected to bonding pads of the first semiconductor chip and bonding pads of the second semiconductor chip.

According to the arrangement above-mentioned, the lengths of the bonding wires can be uniformed. This effectively prevents the bonding wires from coming in contact with one another or from being disconnected due to "wire flow" at the transfer molding step. This further effectively prevents signals from the semiconductor chips from interfering with one another in the bonding wires.

When the semiconductor chips have the same size, the die pad preferably has a contour which is substantially the same as the contour of a figure formed by overlapping two polygons each of which forms the flat shape of each of the semiconductor chips. When the semiconductor chips have different sizes, the die pad preferably has a shape which is at least substantially the same as the shape of the polygon which forms the flat shape of the semiconductor chip whichever is the greater.

According to the arrangement above-mentioned, the die pad can be minimized in area.

In the first semiconductor device above-mentioned, when the flat shape of each of the semiconductor chips is quadrilateral, the following arrangement is preferably added.

The lead frame has a quadrilateral outer frame member having four pieces which support the rear end portions of the outer leads, each of the semiconductor chips has a quadrilateral flat shape, the first semiconductor chip is located in a standard position where the sides of the quadrilateral forming the flat shape of the first semiconductor chip are respectively parallel to the four pieces of the outer frame member, and the second semiconductor chip is located in an inclined position where the sides of the quadrilateral forming the flat shape of the second semiconductor chip are respectively inclined at a predetermined angle with respect to the four pieces of the outer frame member.

In the first semiconductor device, the lead frame may have (i) an intermediate frame member having four pieces respectively parallel to the four pieces of the outer frame member, and (ii) support members extending from those apexes of the contour figure of the die pad which correspond to at least two opposite apexes of the quadrilateral which forms the second semiconductor chip, each of the support members being connected to a part of each of two pieces of the intermediate frame member.

The arrangement above-mentioned can reduce the support members in length to improve the strength.

A modification of the first semiconductor device may comprise: a lead frame having a die pad, a plurality of inner leads of which tips are disposed in the vicinity of the die pad and which extend toward the die pad, outer leads respectively extending from the inner leads, and a quadrilateral outer frame member having four pieces which support the rear ends of the outer leads; a first semiconductor chip mounted on a first face of the die pad of the lead frame and having a quadrilateral flat shape having four sides respectively parallel to the pieces of the outer frame member; a second semiconductor chip mounted on a position adjacent to the first semiconductor chip on the first face of the die pad of the lead frame and having a quadrilateral flat shape which has four sides inclined at a predetermined angle with respect to the pieces of the outer frame member; a third semiconductor chip mounted on a second face of the die pad of the lead frame at the position opposite to the first semiconductor chip through the die pad, the third semiconductor chip having a quadrilateral flat shape which has four sides inclined at a predetermined angle with respect to the pieces of the outer frame member; a fourth semiconductor chip mounted on the second face of the die pad of the lead frame at the position opposite to the second semiconductor chip through the die pad, the fourth semiconductor chip having a quadrilateral flat shape which has four sides respectively parallel to the pieces of the outer frame member; a plurality of bonding pads disposed at each of the sides of each of the first to fourth semiconductor chips; and bonding wires connecting the inner leads and the bonding pads to each other.

According to the arrangement above-mentioned, the first object of the present invention can be achieved even though two semiconductor chips are mounted on each of the faces of the die pad.

To achieve the second object, the present invention provides a second semiconductor device comprises a lead frame comprising: a die pad; a plurality of inner leads of which tips are disposed in the vicinity of the die pad and which extend toward the die pad; outer leads respectively extending from the inner leads; and a rod-like member extending from the tip of at least one of the inner leads toward the space between the inner leads and the die pad. Further, the second semiconductor device comprises, in addition to the lead frame above-mentioned; at least one semiconductor chip mounted on the die pad of the lead frame; a plurality of bonding pads disposed at the semiconductor chip, and bonding wires connecting the inner leads to the bonding pads, the rod-like member being connected to at least two bonding pads through bonding wires.

According to the arrangement above-mentioned, a plurality of bonding wires to supply a power potential, can be connected to the common inner lead and the bonding wires can be prevented from mingling with one another.

To achieve the first object, the present invention provides a method of producing a semiconductor device comprising: a first step of placing, on a first Face of a die pad of a lead frame, a first semiconductor chip having a polygonal flat shape, and fixing the first semiconductor chip to the die pad with adhesives; a second step of placing, on a second face of the die pad, a second semiconductor chip having a polygonal flat shape in which the number of the sides is the same as that of the sides of the first semiconductor chip, the second semiconductor chip being fixed to the die pad with adhesives; a third step of connecting bonding pads of the first semiconductor chip to inner leads through bonding wires; a fourth step of connecting bonding pads of the second semiconductor chip to inner leads through bonding wires; and a fifth step of sealing, with resin, the first and second semiconductor chips, the bonding wires and the inner leads such that they are embedded in the resin, the first and second semiconductor chips being disposed at the first and second steps such that the projected lines, on the die pad, of the corresponding sides of the polygons forming the first and second semiconductor chips, intersect with each other at a predetermined angle.

In the semiconductor device producing method above-mentioned, (i) at the first and second steps, there is preferably used a lead frame in which the tips of the inner leads are located in the sides of a virtual polygon formed by outwardly enlarging a polygon formed by connecting the apexes of the semiconductor chips to one another and in which the number of the inner leads of which tips are located in each of the sides of the virtual polygon, is the same as the number of bonding pads disposed at each of those sides of the semiconductor chips which face to the sides of the virtual polygon, and (ii) at the third and fourth steps, the inner leads of which tips are located in each of the sides of the virtual polygon, are preferably connected to the bonding pads at each of the sides of one of the first and second semiconductor chips, and the inner leads of which tips are located in adjacent two sides of the virtual polygon, are preferably respectively connected to bonding pads of the first semiconductor chip and bonding pads of the second semiconductor chip.

According to the method above-mentioned, the first object can be achieved as above-mentioned.

To achieve the third object, the semiconductor device producing method above-mentioned can be embodied in the following manner.

At the third step, wire-bonding is carried out with a first heating/supporting stand supporting and heating (i) those inner leads out of the inner leads located in those sides of the virtual polygon facing to the sides of the first semiconductor chip and (ii) those parts of the die pad corresponding to the corners of the first semiconductor chip, and at the fourth step, wire-bonding is carried out with a second heating/supporting stand supporting and heating (i) those inner leads out of the inner leads located in those sides of the virtual polygon facing to the sides of the second semiconductor chip and (ii) those parts of the die pad corresponding to the corners of the second semiconductor chip.

According to the method above-mentioned, it is easy not only to prevent a semiconductor chip from being damaged due to the contact thereof with a heating/supproting stand, but also to avoid the interference of a bonding wire with the heating/ stand.

At the third step, wire-bonding may be carried out with a heating/supporting stand supporting (i) the center of the second semiconductor chip and (ii) those inner leads out of the inner leads located in those sides of the virtual polygon facing to the sides of the first semiconductor chip; and at the fourth step, the heating/supporting stand may be rotated on the plane from the position thereof at the third step, and wire-bonding may be carried out with the heating/supporting stand supporting (i) the center of the first semiconductor chip and (ii) those inner leads out of the inner leads located in those sides of the virtual polygon facing to the sides of the second semiconductor chip.

According to the method above-mentioned, wire-bonding can be carried out on the semiconductor chips with the use of one heating/supporting stand.

BRIEF DESCRIPTION OF THE DRAWINGS

FIG. 11 is a plan view of the semiconductor device according to the fourth embodiment of the present invention, when viewed from the face on which third and fourth semiconductor chips are mounted;

FIG. 12 is a plan view of a semiconductor device as a comparative example with respect to the fourth embodiment;

FIG. 13 is a plan view of a modification of the fourth embodiment;

DETAILED DESCRIPTION OF PREFERRED EMBODIMENTS (First Embodiment)

With reference to drawings, the following description will discuss a semiconductor device according to a first embodiment of the present invention.

Figure 1:
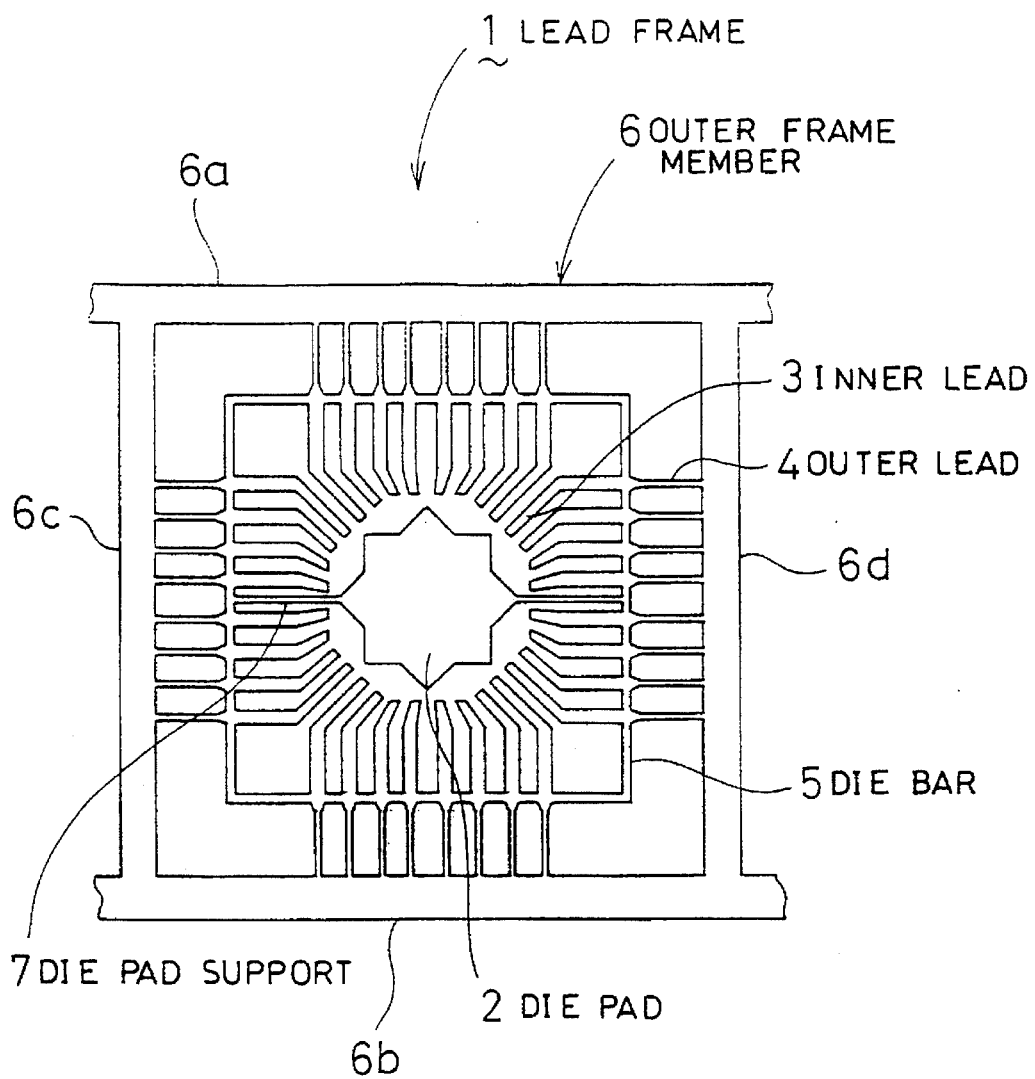
FIG. 1 is a plan view of a lead frame according to a first embodiment of the present invention.

FIG. 1 is a plan view of a QFP lead frame 1 having leads at the four sides thereof, to be used in the semiconductor device of the first embodiment. As shown in FIG. 1, the lead frame 1 has: a die pad 2 having the top serving as a first face and the underside serving as a second face; a plurality of inner leads 3 of which tips are disposed in the vicinity of the outer periphery of the die pad 2 and extend toward the die pad 2; a plurality of outer leads 4 respectively extending from the rear ends of the inner leads 3, the number of the outer leads 4 being the same as the number of the inner leads 3; a tie bar or die bar 5 connecting successively the tips of the outer leads 4 to one another; an outer frame member 6 connecting successively the rear ends of the outer leads 4 to one another; and two die pad supports 7 connecting the die pad 2 and the die bar 5 to each other. The outer frame member 6 has: a top rail 6a and a bottom rail 6b which are parallel to each other; and two side rails 6c, 6d connecting the top rail 6a to the bottom rail 6b. The die bar 5 forms a closed loop in the form of a quadrilateral having four sides parallel to the rails 6a to 6d of the outer frame member 6, respectively.

The following description will discuss the structural characteristics of the lead frame 1 in the first embodiment.

As a first characteristic, the die pad 2 does not have a square flat shape as done in a conventional die pad, but has a star-like pattern of which outermost contour follows the contours of two squares which overlap each other and one of which is rotated at an angle of 45° around the normal line at the center thereof. One square has the four sides respectively parallel to the rails 6a to 6d of the outer frame member 6, while the other square has the four sides respectively inclined at an angle of 45° with respect to the rails 6a to 6d of the outer frame member 6. More specifically, two semiconductor chips are respectively disposed on both faces of the die pad 2 such that, when the respective sides of the semiconductor chips are parallel to the respective sides of the two squares of which contours form the contour of the die pad 2, the projected lines, on the die pad, of the corresponding sides of the semiconductor chips, intersect each other at an angle of 45°.

Figure 2:
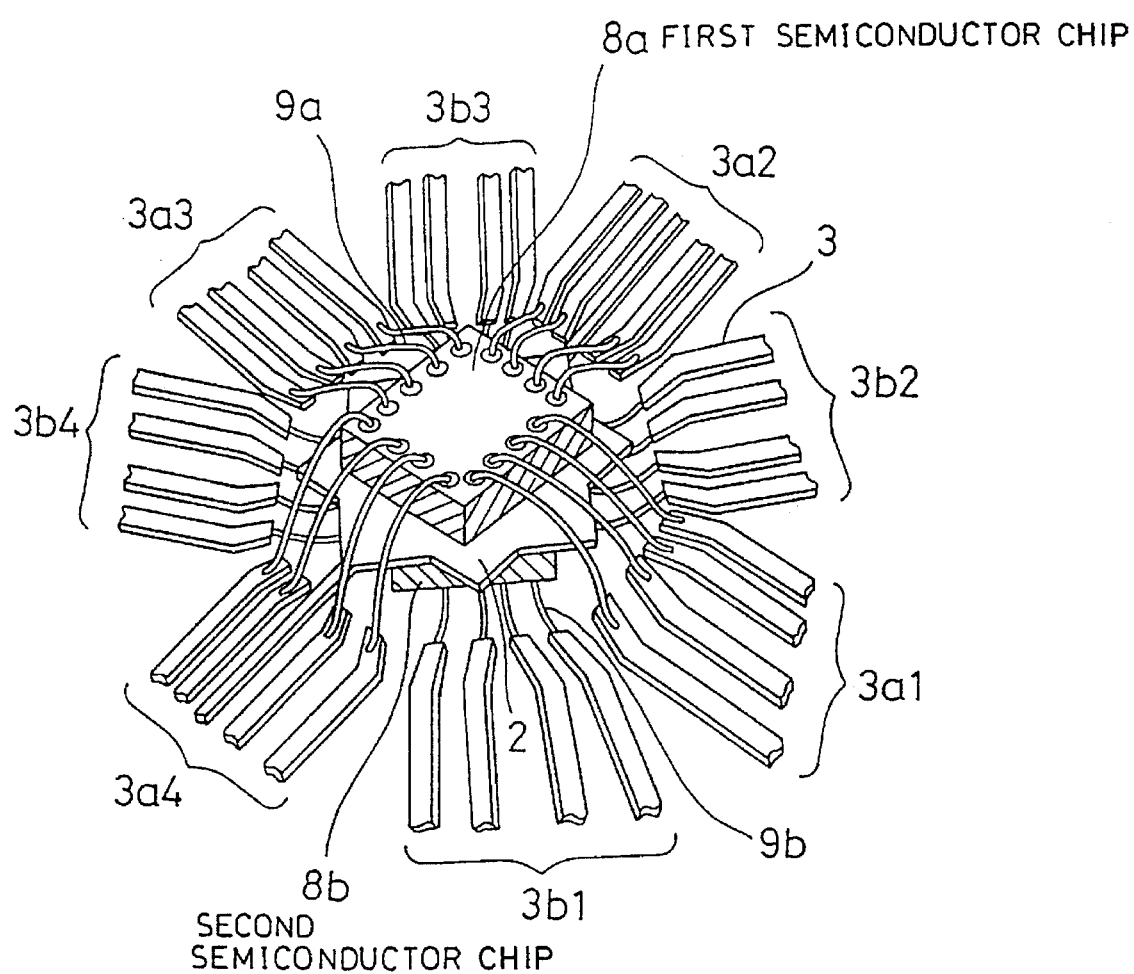
FIG. 2 is a perspective view of a semiconductor device according to the first embodiment of the present invention.

As a second characteristic, provision is made such that the tips of the inner leads 3 are located in the sides of a virtual regular octagon formed by outwardly enlarging a regular octagon formed by connecting the apexes of the two squares of which contours form the contour of the die pad 2. When mounting the semiconductor chips on both faces of the die pad, a first semiconductor chip 8a shown in FIG. 2 is mounted on the first face of the die pad 2 such that the sides of the first semiconductor chip 8a are respectively parallel to the rails 6a to 6d of the outer frame member 6 (standard position), and a second semiconductor chip 8b Is mounted on the second face of the die pad 2 such that the sides of the second semiconductor chip 8b are respectively inclined at an angle of 45° with respect to the rails 6a to 6d of the outer frame member 6 (inclined position). At this time, the sides of the virtual regular octagon respectively face to the sides of the semiconductor chips 8a, 8b.

The effects produced by the two characteristics abovementioned will be discussed later.

As a third characteristic, the die pad supports 7 connect, to the side rails 6c, 6d, two apexes out of the apexes of the square located in the inclined position out of the two squares of which contours form the contour of the die pad 2, these two apexes facing to the side rails 6c, 6d. Thus, when there are disposed the die pad supports 7 connected to the center portions of sides of the die bar 5 instead of the corners of the die bar 5, the lengths of the die pad supports 7 can be shortened to improve the die pad supports 7 in strength. Alternatively, each die pad support 7 may be disposed as extending from each of the four apexes of the square located in the inclined position, and connected to each of the sides of the die bar 5.

FIG. 2 is a perspective view of the semiconductor device in which the first and second semiconductor chips 8a, 8b are mounted on both faces of the die pad 2 of the lead frame 1 and wire-bonded to the lead frame 1. This embodiment is characterized in that the first semiconductor chip 8a is mounted on one face of the die pad 2, while the second semiconductor chip 8b is mounted, as inclined at an angle of 45° with respect to the first semiconductor chip 8a, on the other face of the die pad 2. The number of the inner leads 3 of which tips are located in each of the sides of the virtual regular octagon, is equal to the number of the bonding pads disposed at each of the sides of the semiconductor chips which face to the sides of the virtual regular octagon. Out of the inner leads 3 of which tips are located in the sides of the virtual regular octagon, the inner leads of which tips are located in a side of the virtual regular octagon, are connected, through bonding wires, to the bonding pads disposed at that side of the semiconductor chip which faces to the side above-mentioned of the virtual regular octagon, and the inner leads of which tips are located in adjacent two sides of the virtual regular octagon, are respectively connected, through bonding wires, to bonding pads of the first semiconductor chip and bonding pads of the second semiconductor chip. More specifically, as shown in FIG. 2, inner lead groups 3a1 to 3a4 are connected to the first semiconductor chip 8a through bonding wires 9a, and inner lead groups 3b1 to 3b4 are connected to the second semiconductor chip 8b through bonding wires 9b, and the inner lead groups 3a1 to 3a4 and the inner lead groups 3b1 to 3b4 are alternately located in the sides of the virtual regular octagon. In other words, the tips of the inner lead groups 3a1 to 3a4 connected to the first semiconductor chip 8a are arranged in parallel to the respective sides of the first semiconductor chip 8a having a square contour, and the inner leads 3a1 to 3a4 extend at right angles to the respective sides of the first semiconductor chip 8a at least in the vicinity thereof. The positional relationship between the second semiconductor chip 8b and the inner lead groups 3b 1 to 3b4 connected thereto, is similar to that between the first semiconductor chip 8a and the inner lead groups 3a1 to 3a4. More specifically, the virtual lines formed by connecting the tips of the inner lead groups 3a1 to 3a4 and the virtual lines formed by connecting the tips of the inner lead groups 3b 1 to 3b4, are respectively parallel to the sides of the semiconductor chip 8a where the bonding pads are disposed and the sides of the semiconductor chip 8b where the bonding pads are disposed.

In the first embodiment having the arrangement above-mentioned, the distances between the tips of the inner leads 8 and the semiconductor chips 8a, 8b connected thereto, are made considerably uniform as compared with the conventional arrangement. This causes the lengths of the bonding wires 9a, 9b to be extremely equalized, thereby to prevent particular bonding wires from being excessively long locally. Accordingly, even though a "wire flow" occurs at a transfer molding step, it is possible to effectively prevent the bonding wires 9a, 9b from coming in contact with one another or from being disconnected.

Further, the distances between the bonding wires at the corners of the semiconductor chips are not narrowed as done in the conventional arrangement. This further reduces the probability of the bonding wires coming in contact with one another due to the "wire flow" above-mentioned.

Further, the first semiconductor chip 8a and the second semiconductor chip 8b can be wire-bonded to the inner leads without the bonding wires coming in contact with one another.

Since the semiconductor device of the first embodiment is arranged as above-mentioned, two semiconductor chips can readily be incorporated in one semiconductor device. This can reduce not only the number of semiconductor devices to be mounted on an electronic machine, but also the area occupied by the semiconductor devices. Thus, such an electronic machine can be made in a compact and light design.

In designing the inner leads 3 of the lead frame 1, it is not specially required to arrange the tips of the inner leads 3 in the form of a regular octagon as done in the first embodiment, but these tips may be arranged in the form of a quadrilateral which is a general specification. In such an arrangement, the bonding wires 9a, 9b extending from the bonding pads disposed at the respective sides of the first semiconductor chip 8a and the second semiconductor chip 8b, may collectively be bonded, in a pad group on one side, to the inner leads 3 which are the nearest to the respective sides of the semiconductor chips 8b, 8b. Such an arrangement may also produce similar effects. In such an arrangement, too, the number of the bonding pads is relatively small. Further, such an arrangement can be applied not only to a semiconductor chip such as a memory chip in which bonding pads are formed at two sides thereof, but also to a general semiconductor chip such as a microcomputer or a gate array in which bonding pads are disposed at the four sides thereof.

In the first embodiment, the die pad 2 is made in the form of a star. However, the present invention should not be limited to such a star shape, but the die pad 2 may be octagonal, circular or quadrilateral. In particular, when housing semiconductor chips having different sizes in one semiconductor device, the die pad is made in a shape fit for the shape of the semiconductor chip which is the greatest in size. Thus, the die pad can be reduced in area by disposing, on both faces thereof, two semiconductor chips at the standard position and the inclined position, respectively.

In the first embodiment, one semiconductor chip is inclined at an angle of 45° with respect to the other semiconductor chip. However, the present invention is not limited to such an arrangement. Even though the semiconductor chips are square, provision may be made dependent on conditions such that the semiconductor chips are inclined at other angle than 45° with respect to each other.

Figure 3A:
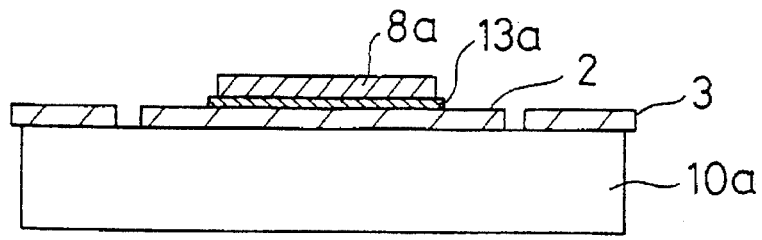
FIG. 3a to FIG. 3e are vertical section views illustrating how the semiconductor device according to the first embodiment changes in structure in the production process.
Figure 3B:
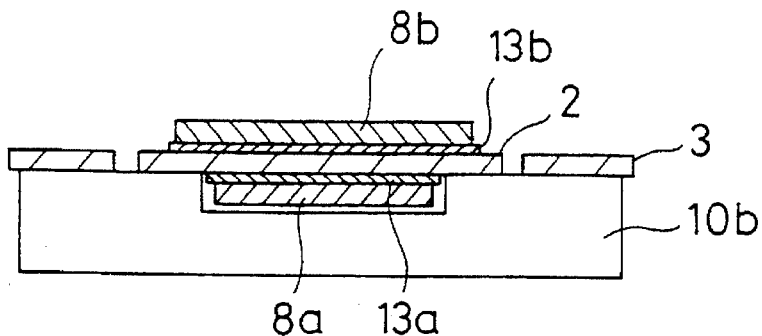
Figure 3C:
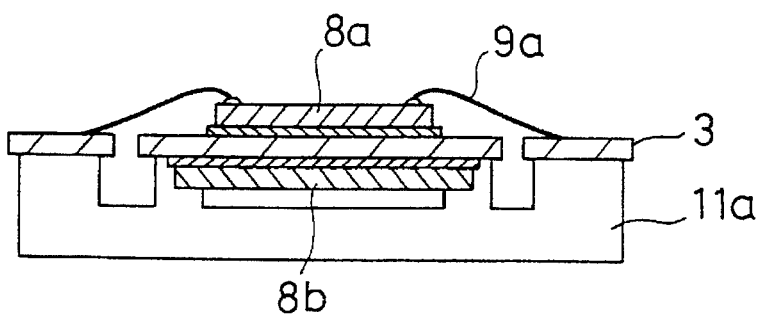
Figure 3D:
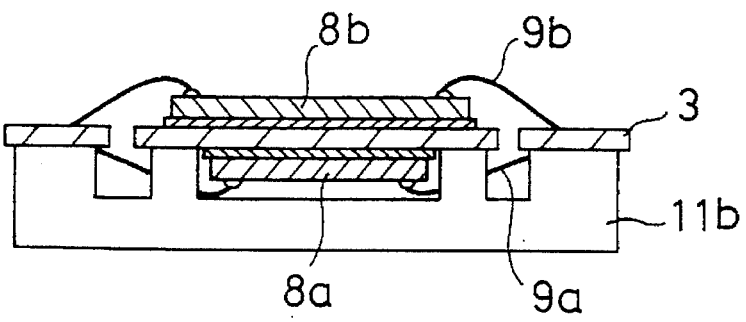
Figure 3E:
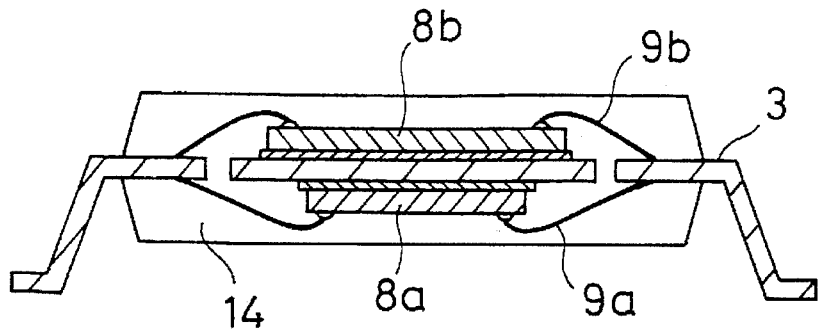

With reference to FIG. 8a to FIG. 3e, the following description will discuss a method of producing a semiconductor device according to the first embodiment. FIG. 3a to FIG. 3e are section views illustrating how the semiconductor device according to the first embodiment changes in structure in the production process.

As shown in FIG. 3a, the first semiconductor chip 8a is disposed on one upwardly turned face of the die pad 2 of the lead frame 1 placed on a flat bonding stand 10a, and secured to this one face of the die pad 2 through first conductive adhesives 13a (first bonding step). At this time, it is not required that hardening the first conductive adhesives 13a has been perfectly finished. More specifically, it is enough that the first conductive adhesives 13a have been hardened to such an extent that the first semiconductor chip 8a is not positionally shifted or does not come off even though the lead frame 1 is turned over at the subsequent die bonding step for the second semiconductor chip 8b.

However, when two lead frames are used and there are continuously conducted (i) mounting a semiconductor chip on one face of each of the two lead frames, (ii) wire bonding and (iii) resin sealing, it is required that hardening the first conductive adhesives has been perfectly finished at the time of wire bonding. If hardening the first conductive adhesives has not been perfectly finished, this involves the likelihood that the semiconductor chip is positionally shifted, comes off or is lowered in bonding strength due to supersonic vibration at the time of wire bonding. This also involves the likelihood that the resin is cracked due to swelling of residual gas in the conductive adhesives because of a sudden rise in temperature at a reflow soldering step. Accordingly, it is required that hardening the first conductive adhesives has completely been finished in a sufficient period of time.

As shown in FIG. 3b, the lead frame 1 is turned over such that the face of the lead frame 1 on which the first semiconductor chip 8a is mounted, is turned down, and the lead frame 1 is placed on a bonding stand 10b. The bonding stand 10b is provided in the center thereof with a concave to prevent the first semiconductor chip 8a from interfering with the bonding stand 10b. Placed on the upwardly turned die pad 2 is the second semiconductor chip 8b as rotated at an angle of 45° around the normal line on the die pad face with respect to the first semiconductor chip 8a disposed at the underside of the die pad 2. The second semiconductor chip 8b is securely fixed to the die pad 2 with second conductive adhesives 13b (second die bonding step). It is noted that a predetermined period of time for completing the hardening of the second conductive adhesives 13b, is the same as that for the first conductive adhesives 13a. At this time, the first semiconductor chip 8a is die-bonded as located in the standard position shown in FIG. 1, while the second semiconductor chip 8b is die-bonded as located in the inclined position. Then, the second conductive adhesives 13b are hardened for a predetermined period of time such that hardening the conductive adhesives 13a, 13b is completed. Accordingly, even though the period of time during which the first conductive adhesives 13a are hardened, is shorter than the predetermined hardening period of time, hardening the first conductive adhesives 13a can be completed in the course of the subsequent hardening step for the second conductive adhesives 13b. This can shorten the period of time required for producing such a semiconductor device. It is noted that the bonding stand 10a shown in FIG. 3a is not necessarily required to be flat, but the concave bonding stand 10b shown in FIG. 3b may commonly be used even at the first bonding step.

As shown in FIG. 3c, the semiconductor chips 8a, 8b bonded to the both faces of the die pad 2, are subjected to a wire-bonding step. More specifically, that face of the lead frame 1 on which the second semiconductor chip 8b is mounted, is turned downward, and the lead frame 1 is placed on a first heating/supporting stand 11a, and the bonding pads of the first semiconductor chip 8a are connected to the inner lead groups 3a1 to 3a4 through the bonding wires 9a (first wire-bonding step).

Figure 4:
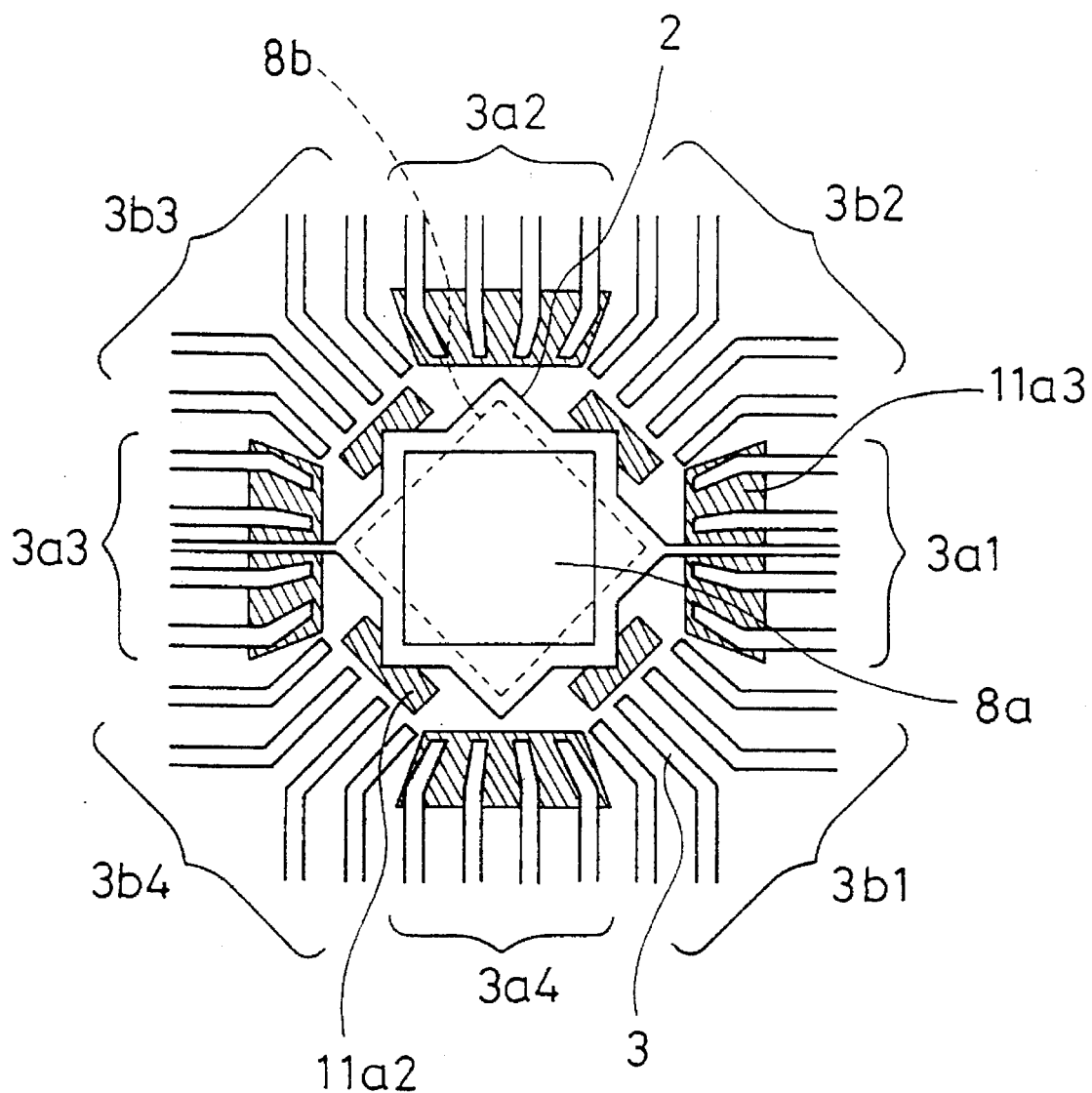
FIG. 4 is a plan view illustrating how the semiconductor device is supported by a heating/supporting stand in a first wire bonding step according to the first embodiment.

The first heating/supporting stand 11a is provided with a concave such that the second semiconductor chip 8b does not interfere with the first heating/supporting stand 11a. That is, only the portions for holding the lead frame 1, project. FIG. 4 is a plan view of FIG. 3c. The first heating/supporting stand 11a has inner lead holding portions 11a3 and die pad holding portions 11a2 for holding the inner leads 3 and the die pad 2, respectively. These portions 11a3 and 11a2 are hatched in FIG. 4c. More specifically, the inner lead holding portions 11a3 are disposed at four positions under the inner lead groups 3a1 to 3a4 to be wire-bonded to the first semiconductor chip 8a, and the die pad holding portions 11a2 are disposed at four positions under the corners of the first semiconductor chip 8a on the die pad 2. Thus, by holding the lead frame 1, the second semiconductor chip 8b neither comes in contact nor interferes with the first heating/supporting stand 11a. This prevents the second semiconductor chip 8b from being damaged such that the production yield of semiconductor devices is not lowered.

As shown in FIG. 3d, after the first wire-bonding step has been finished, the lead frame 1 is turned over to turn downward that face of the lead frame 1 on which the first semiconductor chip 8a is mounted, and the lead frame 1 is placed on a second heating/supporting stand 11b and the bonding pads of the second semiconductor chip 8b are connected to the inner lead groups 3b1 to 3b4 through the bonding wires 9b (second wire-bonding step).

Figure 5:
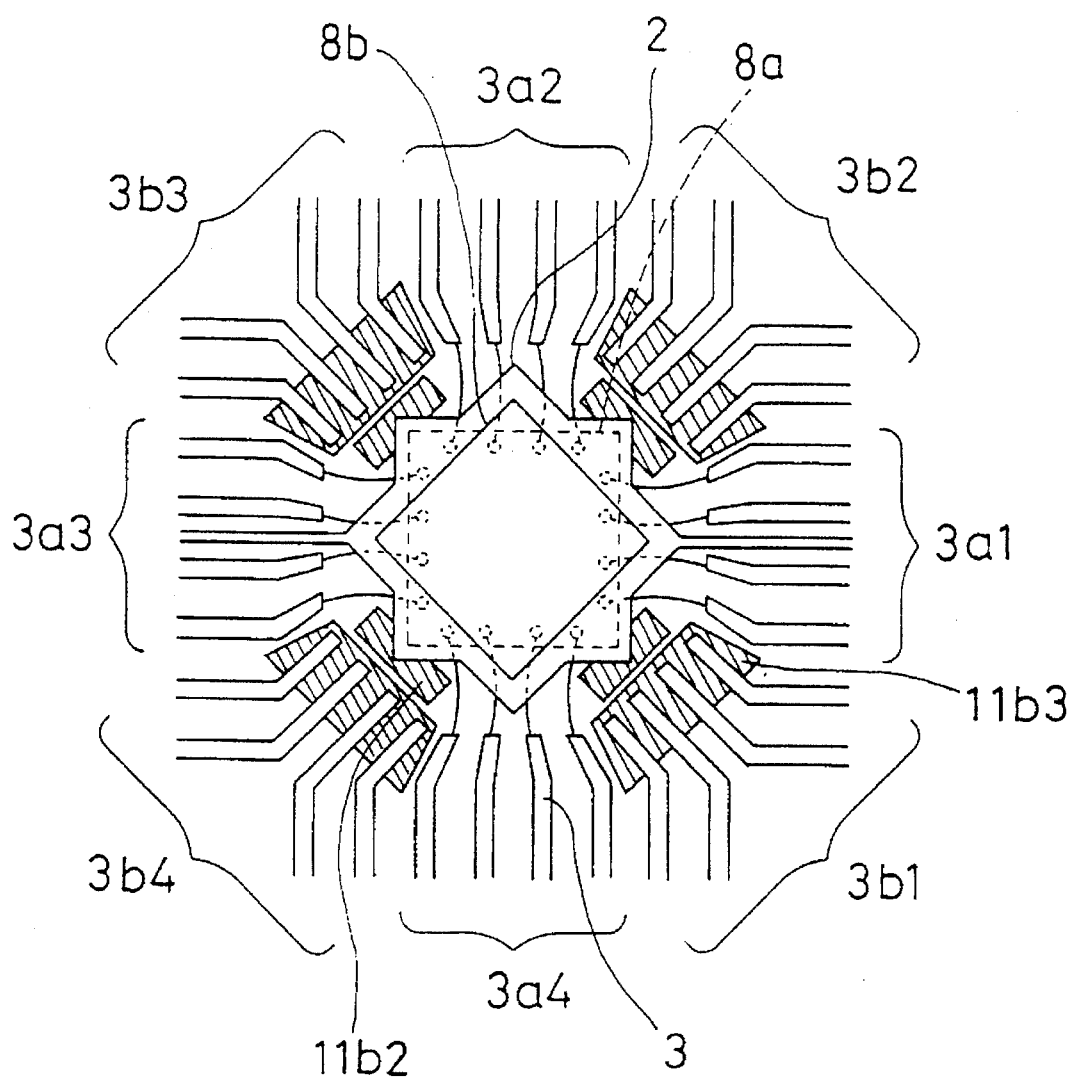
FIG. 5 is a plan view illustrating how the semiconductor device is supported by a heating/supporting stand in a second wire bonding step according to the first embodiment.

Likewise the first heating/supporting stand 11a, the second heating/supporting stand 11b has concave and convex portions such that the second heating/supporting stand 11b does not come in contact with the first semiconductor chip 8a or the bonding wires 9a of the first semiconductor chip 8a. FIG. 5 is a plan view of FIG. 3d. In FIG. 5, there are hatched inner lead holding portions 11b3 and die pad holding portions 11b2 of the second heating/supporting stand 11b. More specifically, the inner lead holding portions 11b3 are disposed at four positions under the inner lead groups 3b1 to 3b4 to be wire-bonded to the second semiconductor chip 8b, and the die pad holding portions 11b2 are disposed at four positions under the corners of the second semiconductor chip 8b on the die pad 2. At this time, the inner lead holding portions 11a3 of the second heating/supporting stand 11b are formed at the positions shifted at an angle of 45° on the plane with respect to the positions where the inner lead holding portions 11a3 of the first heating/supporting stand 11a are formed as shown in FIG. 4. Holding the lead frame 1 in this manner prevents the first semiconductor chip 8a and the bonding wires 9a thereof from coming in contact and interfering with the second heating/supporting stand 11b. This effectively prevents not only the first semiconductor chip 8a from being damaged but also the bonding wires 9a of the first semiconductor chip 8a from being deformed or disconnected, thus improving the production yield of semiconductor devices. Further, the semiconductor chips 8a, 8b are not supported by the heating/supporting stands 11a, 11b. This securely prevents the semiconductor chips 8a, 8b from being damaged due to the contact thereof with the heating/supporting stands 11a, 11b, respectively.

As shown in FIG. 3e, after the wire bonding step has been finished for the second semiconductor chip 8b, the semiconductor chips 8a, 8b, the bonding wires 9a, 9b and the portion of the lead frame 1 except for the outer portion thereof, are sealed with molding resin 14 (transfer molding step) in order to protect the semiconductor chips 8a, 8b, the bonding wires 9a, 9b and the like from external environment to increase the resulting semiconductor device in reliability.

With the steps above-mentioned, there is obtained a semiconductor device in which two semiconductor chips 8a, 8b are respectively mounted on the both faces of the die pad 2.

The present invention should not be limited to the first embodiment, but may also be applied to a semiconductor device having a multi-layer frame in which a semiconductor chip is mounted on one faces of two lead frames and those other faces of the lead frames opposite to the one faces thereof on which the semiconductor chips are mounted, are laminated to each other. In such an arrangement, there may be used lead frames one of which has a die pad having a square pattern having four sides respectively parallel to the rails, and the other of which has a die pad having a square pattern having four sides respectively inclined at an angle of 45° on the plane with respect to the rails. In such an arrangement, the connection shown in FIG. 2 can be achieved. The lead frames may be laminated to each other with or without an insulating film interposed therebetween.

In addition, in case with the two semiconductor chips 8a, 8b which are different in size, for example, in case with the first semiconductor chip 8a of larger size and the second semiconductor chip 8b of smaller size which is provided on the reverse side of the square-shaped die pad 2, the first wire-boding step shown in FIG. 3c is preferably carried out to the larger semiconductor chip 8a with priority. In so doing, the die pad 2 is stably supported because of large area of the die pad holding portions 11a2 and less intervals therebetween. Further, at the second wire-bonding step shown in FIG. 3d, the die pad 2 is supported at its four corners, which means stable support. Hence, deflection and vibration of the die pad 2 due to impact at the wire-bonding are prevented, enhancing the reliability in connection of the wire-bonding.

(Second Embodiment)

The following description will discuss a second embodiment of the present invention.

Figure 6A:
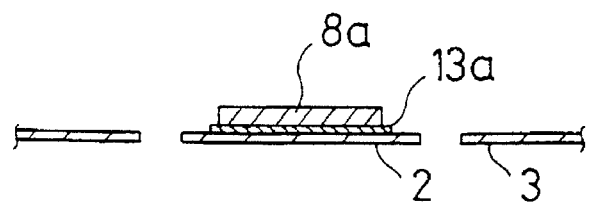
FIG. 6a to FIG. 6e are vertical section views illustrating how the semiconductor device according to a second embodiment of the present invention changes in structure in the production process.
Figure 6B:
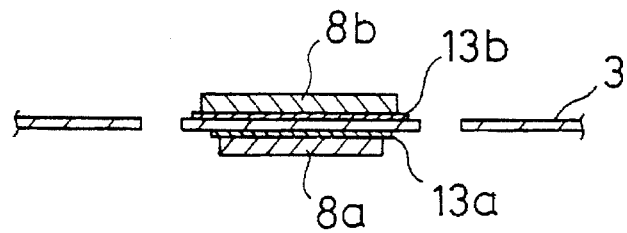

As shown in FIGS. 6a and 6b, steps similar to the steps shown in FIGS. 3a and 3b in the first embodiment (first and second die-bonding steps) are conducted to mount first and second semiconductor chips 8a, 8b on both faces of a die pad 2 of a lead frame 1.

Figure 6C:
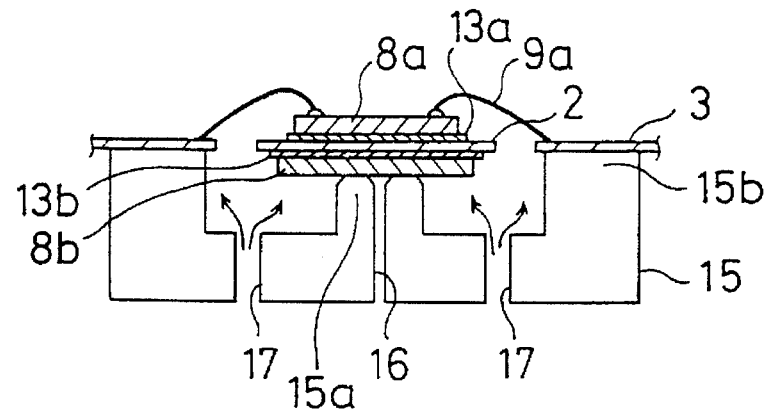
Figure 6D:
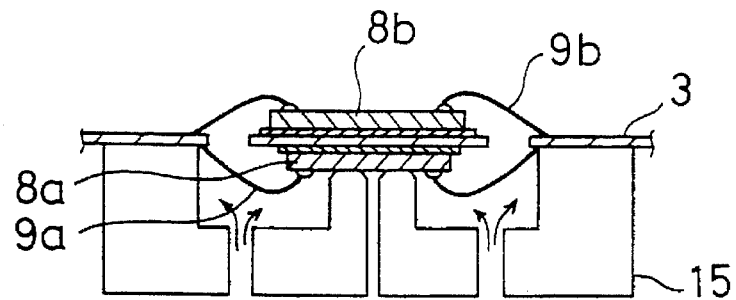

As shown in FIGS. 6c, and 6d, a first wire bonding step and a second wire bonding step are respectively conducted on the first semiconductor chip 8a mounted on one face of the die pad 2 and the second semiconductor chip 8b mounted on the other face of the die pad 2. Since the wire-bonding method itself is basically the same as that used in the first embodiment, the description thereof is here omitted.

As a characteristic of the second embodiment, a heating/supporting stand 15 having the following structure is commonly used for the first and second wire bonding steps. The heating/supporting stand 15 is provided at the center thereof with a projection serving as a chip holding portion 15a for holding the semiconductor chip 8a or 8b, and the chip holding portion 15a has a suction hole 16 to be connected to a vacuum device. Gas supply holes 17 to be connected to an inert gas tank are formed in the bottom wall of a concave portion around the center of the heating/supporting stand 15. Outer portions with respect to the concave portion of the heating/supporting stand 15, project more than the center of the heating/supporting stand 15. These projecting outer portions serve as inner lead holding portions 15b. More specifically, the heating/supporting stand 15 is arranged such that, at the wire-bonding steps in FIGS. 6c, and 6d, the lead frame 1 is held by the inner lead holding portions 15b, the faces of the semiconductor chips 8a, 8b are vacuum-sucked by the suction hole 16 such that the semiconductor chips 8a, 8b are secured to the chip holding portion 15a, and heated inert gas is blown against the peripheries of the first and second semiconductor chips 8a, 8b through the gas supply holes 17. This enables the semiconductor chips 8a, 8b and the inner leads 3 to be sufficiently heated such that the wire-bonding steps can successfully be conducted. The supply of inert gas prevents the inner leads 3 and the lead frame 1 from being oxidized. This effectively prevents both reduction in junction strength and defective junction at the wire-bonding steps.

Figure 7:
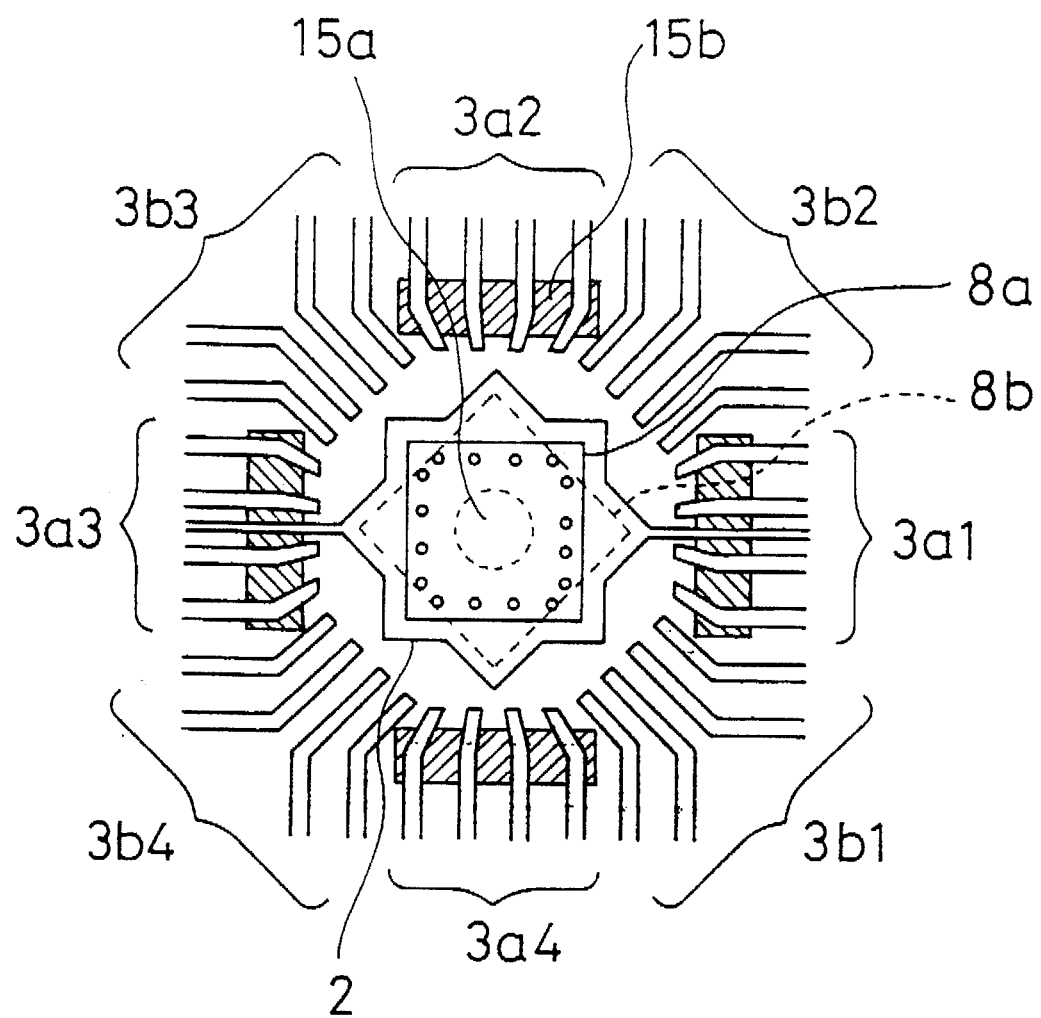
FIG. 7 is a plan view illustrating how the semiconductor device is supported by a heating/supporting stand in a first wire bonding step according to the second embodiment.
Figure 8:
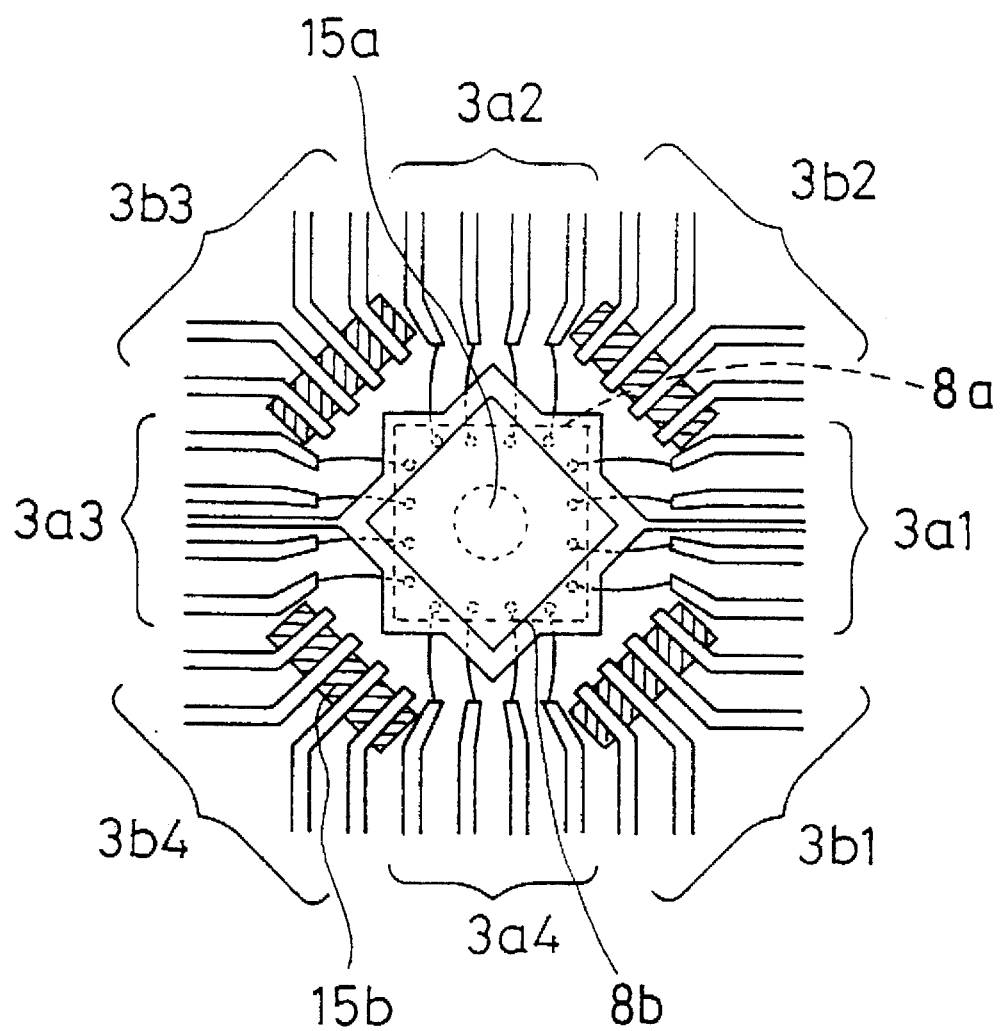
FIG. 8 is a plan view illustrating how the semiconductor device is supported by a heating/supporting stand in a second wire bonding step according to the second embodiment.

FIG. 7 is a plan view of FIG. 6c, and FIG. 8 is a plan view of FIG. 6d. As shown in FIGS. 7 and 8, the inner lead holding portions 15b of the heating/supporting stand 15 at the first wire bonding step, are positionally inclined at an angle of 45° on the plane with respect to the inner lead holding portions 15b at the second wire bonding step. However, it is not required to dispose two heating/supporting stands respectively having different shapes. That is, at the second wire bonding step, it is enough to rotate the heating/supporting stand 1S at an angle of 45° on the plane from the position where the heating/supporting stand 15 is located at the first wire bonding step.

Figure 6E:
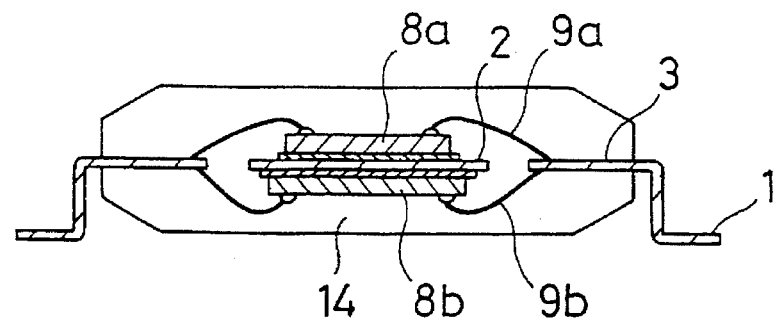

Finally, as shown in FIG. 6e, a transfer molding step identical with that shown in FIG. 3e in the first embodiment, is carried out to complete the mounting process.

In the second embodiment, that portion of the heating/supporting stand 15 which is used for vacuum-sucking the semiconductor chips 8a, 8b, may be coated with Teflon or the like (not shown) to prevent the faces of the semiconductor chips 8a, 8b from being damaged.

In the production process according to the second embodiment, there is no possibility of the bonding wires 9b or the semiconductor chips 8a, 8b interfering with the heating/supporting stand. In particular, the same heating/supporting stand 15 can be used at the first and second wire bonding steps. Thus, the second embodiment is advantageous as compared with the first embodiment in that provision of a single heating/supporting stand is sufficient.

(Third Embodiment)

Figure 9:
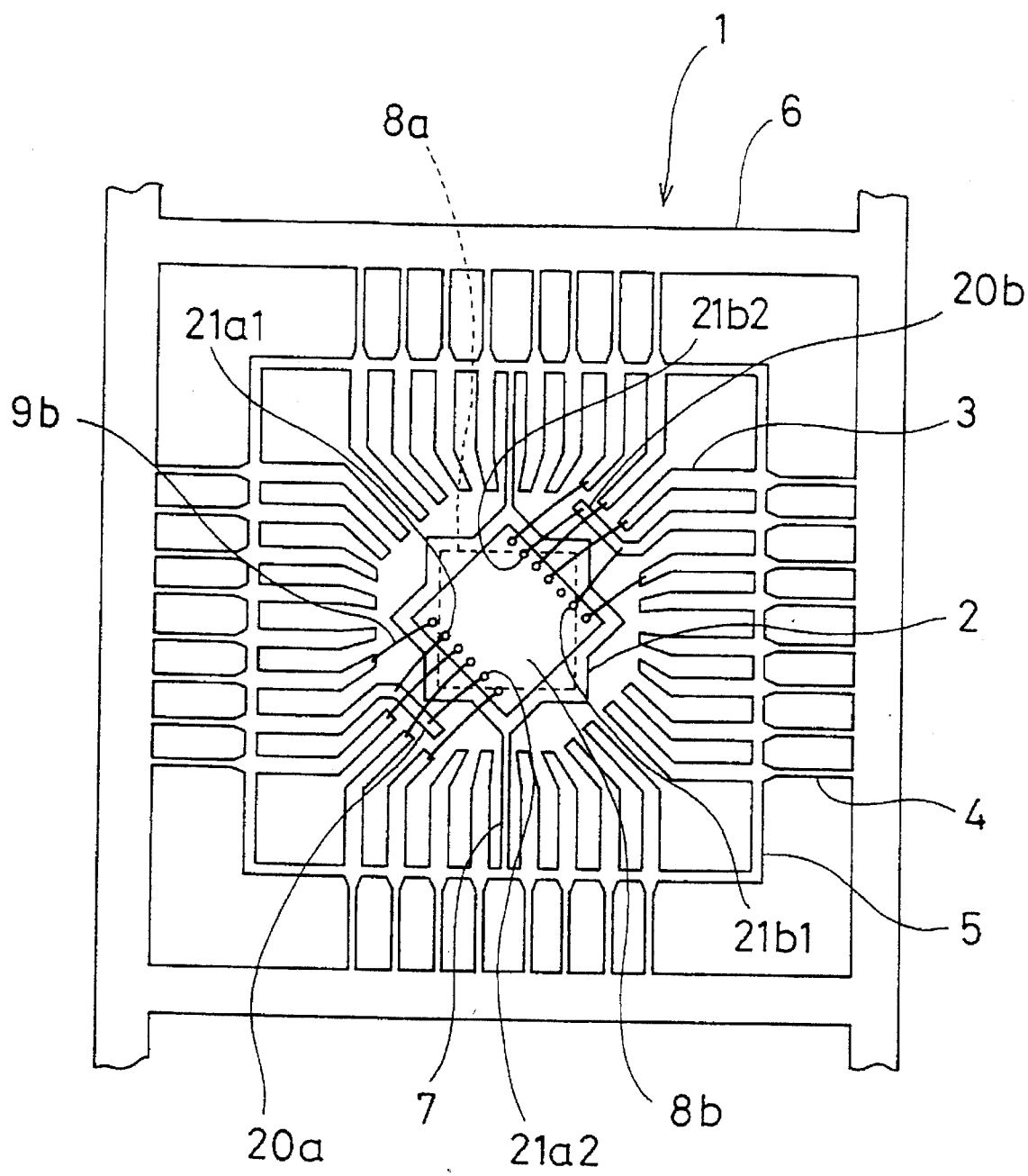
FIG. 9 is a plan view of a semiconductor device according to a third embodiment of the present invention.

The following description will discuss a third embodiment of the present invention. FIG. 9 is a plan view of a semiconductor device according to the third embodiment when viewed from the face on which a second semiconductor chip 8b is mounted. As shown in FIG. 9, a lead frame 1 has a die pad 2, inner leads 8, outer leads 4, a die bar 5, an outer frame member 6 and die pad supports 7 of which respective shapes are basically the same as those shown in the first embodiment, and the shapes of first and second semiconductor chips 8a, 8b are also basically the same as those shown in the first embodiment.

According to a characteristic of the third embodiment, two of a large number of inner leads 8 have rod-like common lead portions 20a, 20b which respectively extend, between the tips of inner leads 8 and the die pad 2, substantially in parallel to lines along which the tips of the inner leads 8 are arranged. Through bonding wires 9b, there are connected, to the common lead portion 20a, two bonding pads 21a1, 21a2 which are out of the bonding pads on the second semiconductor chip 8b and which are located in positions remote from each other. Through bonding wires 9b, there are connected, to the other common lead portion 20b, two bonding pads 21b1, 21b2 which are out of the bonding pads on the second semiconductor chip 8b and which are located in positions remote from each other. More specifically, the common lead portion 20a is formed as extending over two positions opposite to the bonding pads 21a1, 21a2 to be connected to the common lead portion 20a, and the common lead portion 20b is formed as extending over two positions opposite to the bonding pads 21b1, 21b2 to be connected to the common lead portion 20b.

According to the third embodiment, even though there are present, on a semiconductor chip, a plurality of bonding pads desired to be connected to a common inner lead, such bonding pads can securely be connected to the common lead without the bonding wires coming in contact with one another. In particular, even though such bonding pads are remote from one another, the bonding pads can readily be connected to a common inner lead by disposing the common inner lead at the tip of an inner lead such that the common inner lead extends over a plurality of positions opposite to the bonding pads to be connected to the common inner lead. Even in a semiconductor chip of which power consumption is great, a plurality of electrodes can be connected to a common lead portion through a plurality of bonding wires. This alleviates the concentration of an electric current to the bonding wires. This effectively prevents the bonding wires from being disconnected due to blowout, thus improving the semiconductor device in reliability. Further, by disposing a plurality of bonding wires to be connected to the power electrodes and collectively connecting such bonding wires to a single thick inner lead, the power noise can be reduced. That is, provision of a simple structure such as the common lead portions 20a, 20b as done in the third embodiment, can improve the semiconductor device in reliability.

(Fourth Embodiment)

Figure 10:
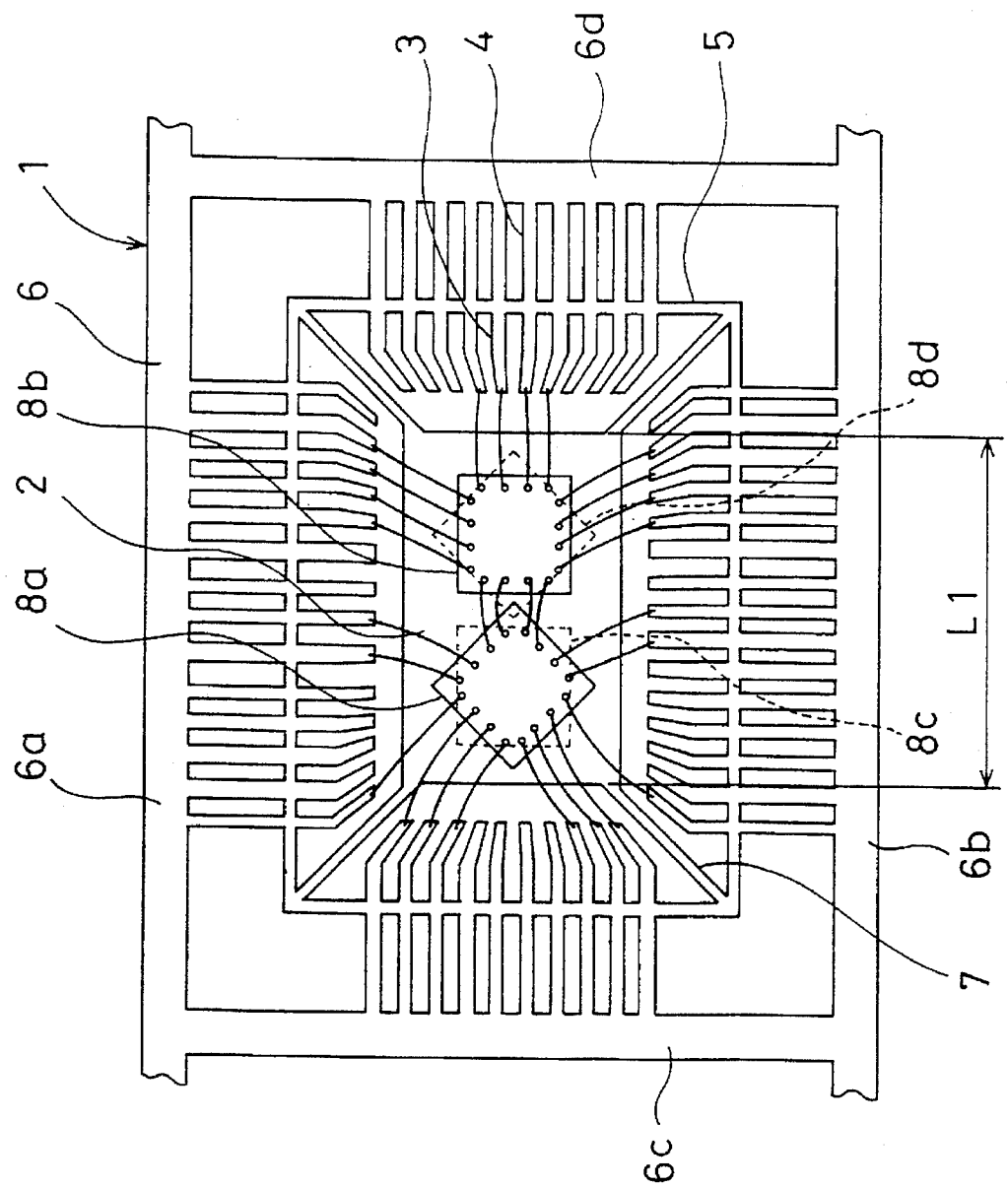
FIG. 10 is a plan view of a semiconductor device according to a fourth embodiment of the present invention, when viewed from the face on which first and second semiconductor chips are mounted.
Figure 14A:
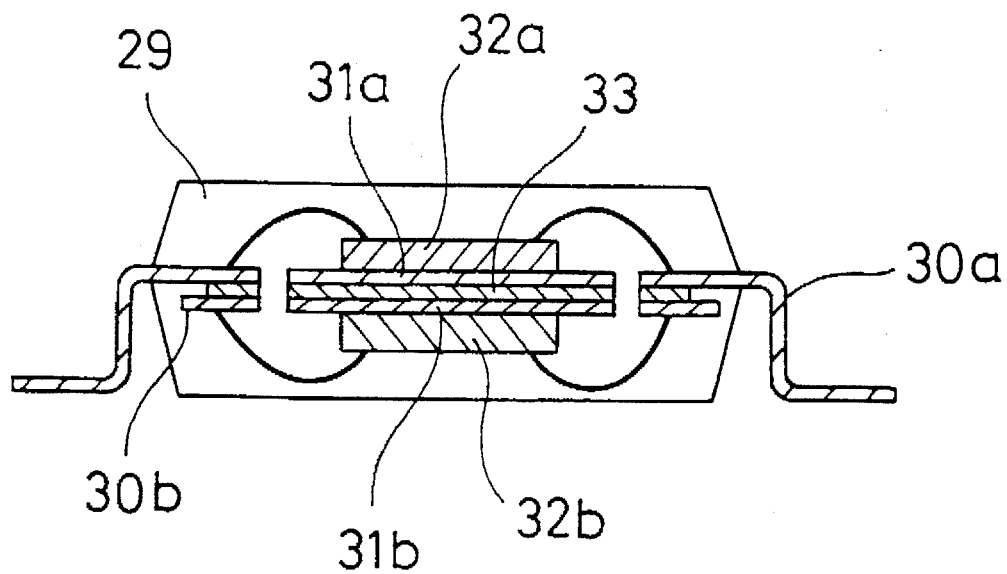
FIG. 14a and FIG. 14b are vertical section views of a conventional semiconductor device having a multi-layer lead frame and a conventional semiconductor device having a single-layer lead frame.
Figure 14B:
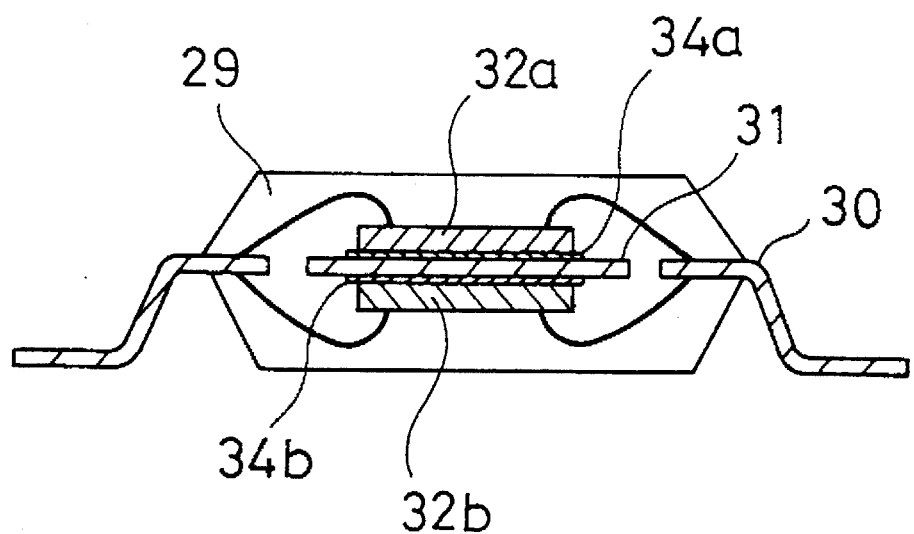
Figure 15:
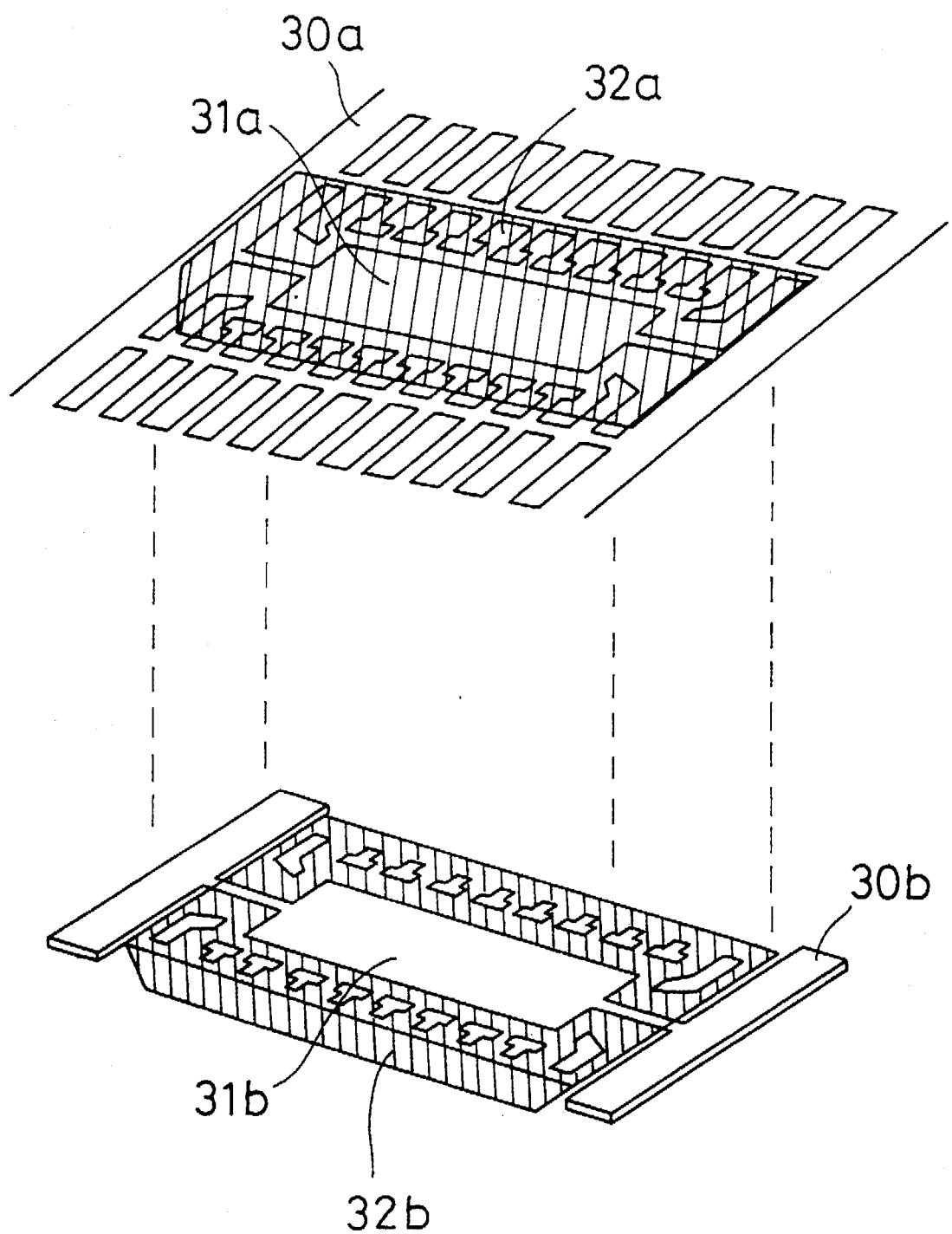
FIG. 15 is a perspective view schematically illustrating a method of producing a conventional semiconductor device having a multi-layer lead frame.
Figure 16A:
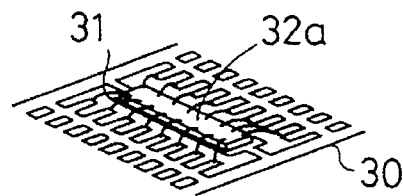
FIG. 16a to FIG. 16d are vertical section views illustrating how a conventional semiconductor device having a single-lager lead frame changes in structure in the production process.
Figure 16B:
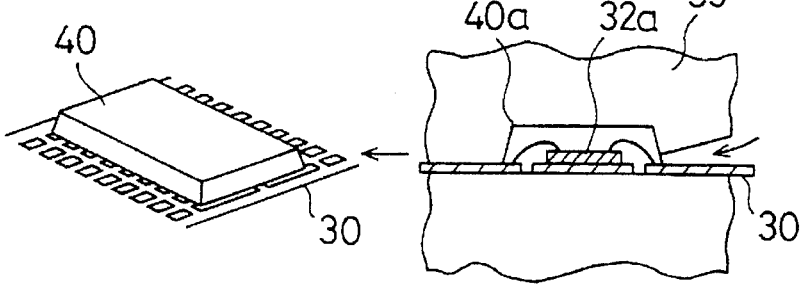
Figure 16C:
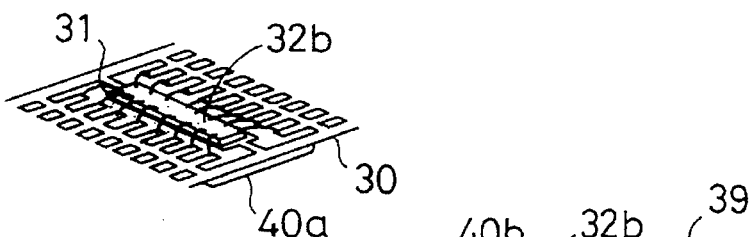
Figure 16D:
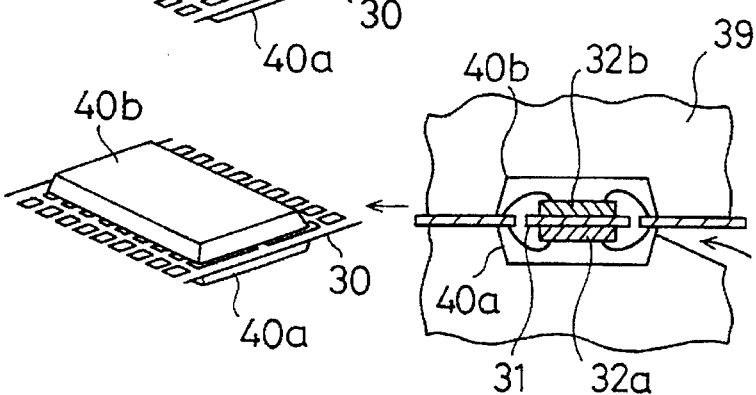

The following description will discuss a fourth embodiment of the present invention. FIGS. 10 and 11 are plan views illustrating the arrangement of a semiconductor device of the fourth embodiment when viewed from above and below, respectively. In the fourth embodiment, a die pad 2 of a lead frame 1 has a rectangular pattern. The tips of inner leads 3 are arranged along the sides of the die pad 2, and outer leads 4 respectively extend from the inner leads 3. Each of a die bar 5 and an outer frame member 6 has a rectangular pattern. In the fourth embodiment, die pad supports 7 are disposed at four positions of the corners of the die pad 2 and connected to the corners of the die bar 5.

According to a characteristic of the fourth embodiment, two semiconductor chips 8a, 8b are disposed on one face of the die pad 2 while two semiconductor chips 8c, 8d are disposed on the other face of the die pad 2. Out of the semiconductor chips 8a to 8d, the first and fourth semiconductor chips 8a, 8d are disposed at the inclined position, while the second and third semiconductor chips 8b, 8d are disposed at the standard position. More specifically, the sides of the first and second semiconductor chips 8a, 8b mounted on one face are inclined at an angle of 45° on the plane with respect to each other, and the sides of the third and fourth semiconductor chips 8c, 8d mounted on the other face are also inclined at an angle of 45° on the plane with respect to each other. Further, the first semiconductor chip 8a and the third semiconductor chip 8c of which centers are located substantially in the same position, are disposed such that the projected lines, on the die pad 2, of the corresponding sides thereof intersect with each other at an angle of 45°.

According to the fourth embodiment having the arrangement above-mentioned, the total four semiconductor chips 8a to 8d can be housed in a single semiconductor device and the die pad 2 can be lowered in area, thus lowering the volume of the semiconductor device in its entirety.

FIG. 12 is a plan view of a semiconductor device as a comparative example which is shown for comparison of the area of the die pad with the semiconductor device according to the fourth embodiment. When mounting the total four semiconductor chips 8a to 8d on the die pad 2, i.e., two semiconductor chips on each face of the die pad 2, both the first and second semiconductor chips 8a, 8b mounted on one face are arranged at the standard position and the third and fourth semiconductor chips 8c, 8d mounted on the other face are arranged at the inclined position as shown in FIG. 12. In such an arrangement, the corners of the third and fourth semiconductor chips 8c, 8d get close to each other. It is therefore required to dispose the semiconductor chips 8c, 8d such that the centers thereof are sufficiently apart from each other. Accordingly, the length L2 of the die pad 2 of the semiconductor device of the comparative example is inevitably greater than the length L1 of the longer side of the die pad 2 of the semiconductor device according to the fourth embodiment.

According to the fourth embodiment, it is difficult to connect one of the inner lead groups to the bonding pads disposed on one side of a same semiconductor chip as done in the first embodiment, and some bonding wires become longer. However, the fourth embodiment can produce effects similar to those produced by the first embodiment. Further, the reduction in the area of the die pad can improve the semiconductor device in reliability.

Figure 17A:
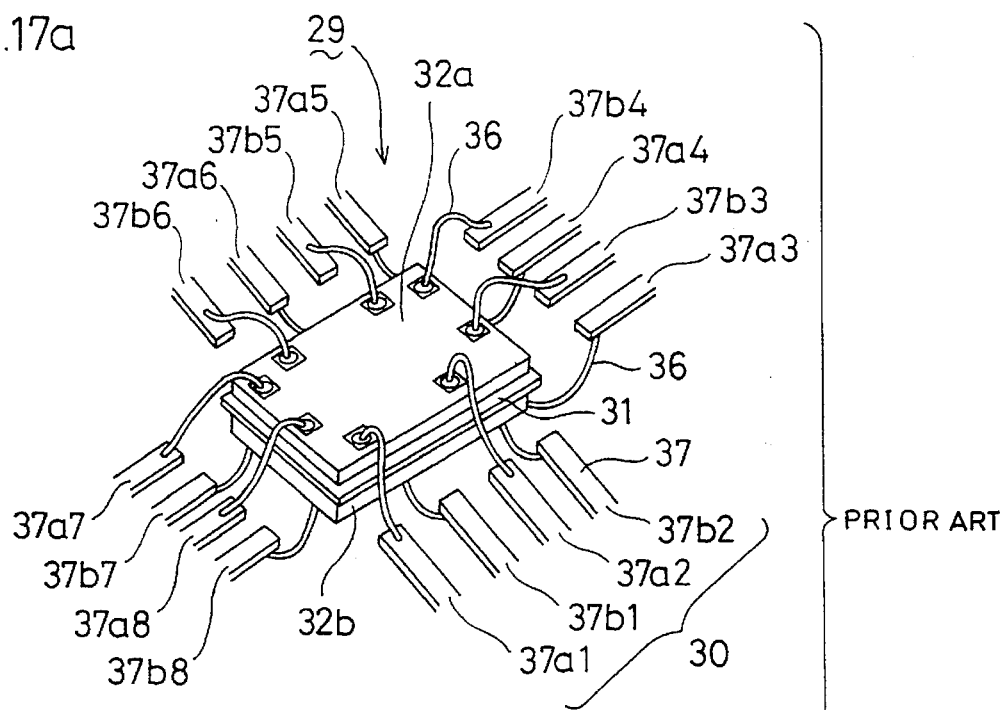
FIG. 17a to FIG. 17b are a perspective view illustrating how the wires are bonded in a conventional semiconductor device in which semiconductor chips are mounted on both faces of a die pad, and a plan view of the semiconductor device for which a transfer molding process has been finished.
Figure 17B:
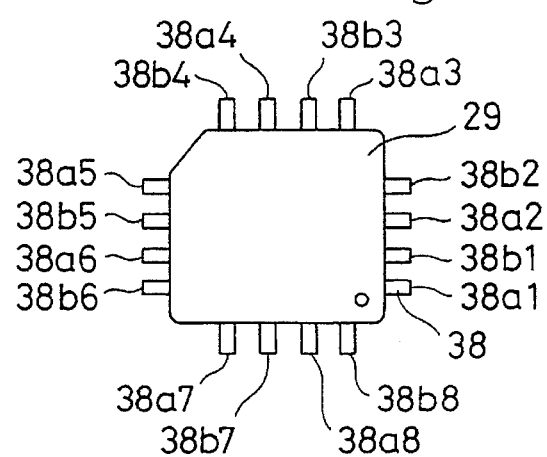
Figure 18A:
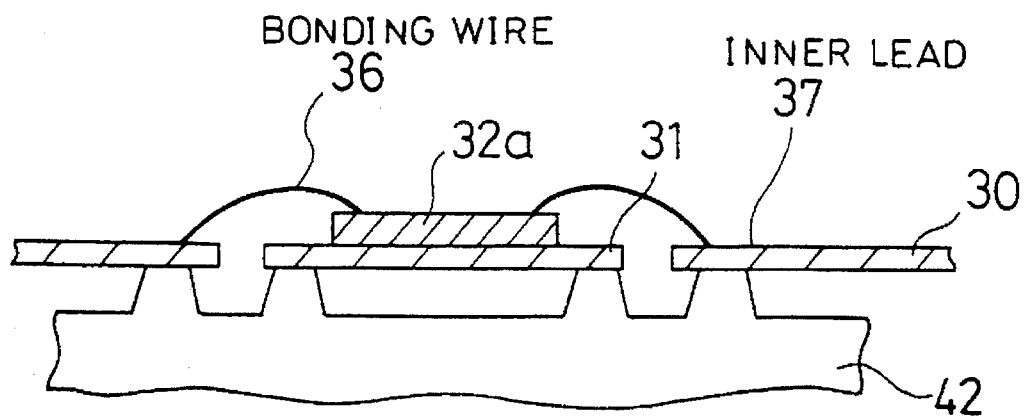
FIG. 18a and FIG. 18b are Vertical section views illustrating how a conventional semiconductor device having a single-layer lead frame is placed on a heating/supporting stand at first and second wire bonding steps.
Figure 18B:
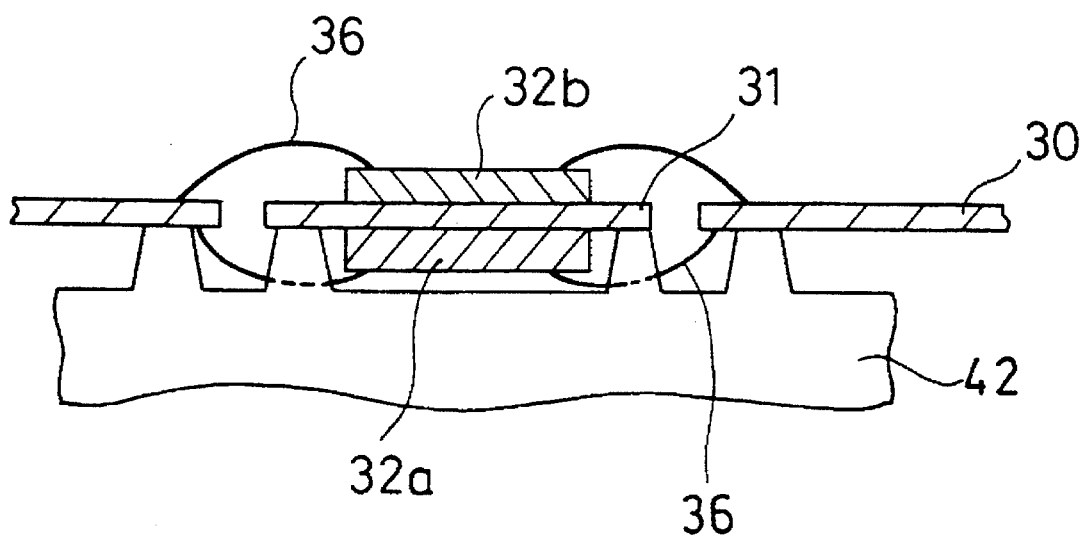
Figure 19:
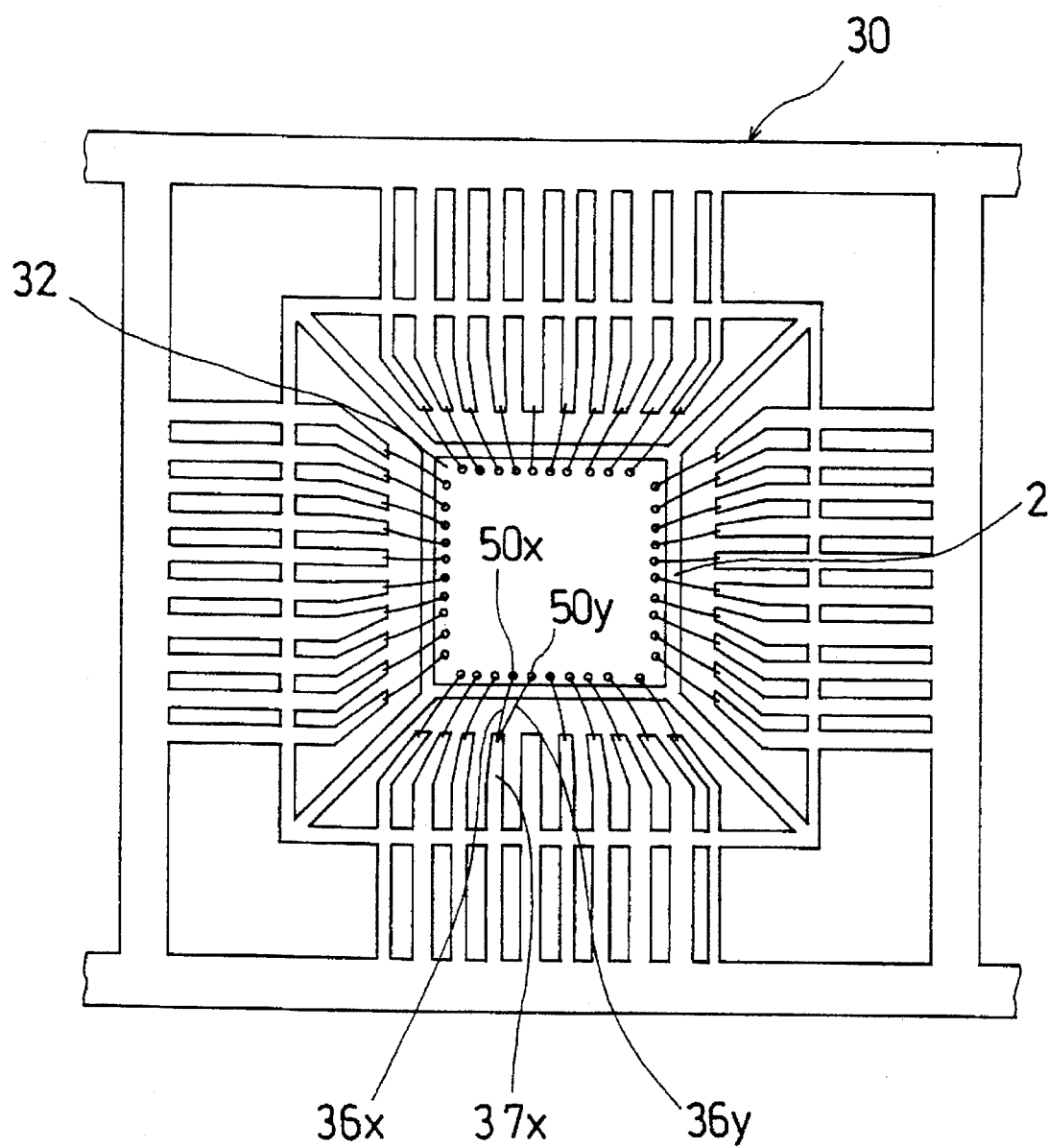
FIG. 19 is a plan view illustrating how one inner lead is wire-bonded to a plurality of bonding pads in a conventional semiconductor device.

When two semiconductor chips 8a, 8b are disposed at the standard position as done in the comparative example in FIG. 12, the distances between adjacent bonding wires connected to the bonding pads formed at the opposite sides of the semiconductor chips 8a, 8b, are very narrowed. This involves the likelihood that there is increased the probability that the bonding wires come in contact with one another due to a "wire flow", thus lowering the reliability. Further, when two semiconductor chips to be mounted on each face of one die pad are arranged at the standard position as conventionally done, there is extremely increased the probability that the bonding wires come in contact with one another as above-mentioned. When there is adopted a connecting method as shown in FIG. 17 in order to avoid the problems above-mentioned, a crosstalk may possibly take place between signals of the semiconductor chips as above-mentioned.

To house four semiconductor chips in one semiconductor device without the four semiconductor chips mounted on the same die pad, there may be used an arrangement as shown in FIG. 13. In this arrangement, too, two semiconductor chips on one face and two semiconductor chips on the other face are arranged at the standard position and the inclined position, respectively. However, the volume of the semiconductor device in its entirety is considerably greater than that of the fourth embodiment. In the arrangement in FIG. 13, however, each of the inner lead groups can securely be connected to the bonding pads on each of the sides of a semiconductor chip such that the reliability is advantageously increased.

What is claimed is:

1. A semiconductor device comprising:

a lead frame having a die pad, a plurality of inner leads each having tips disposed in proximity to said die pad and which extend toward said die pad, and outer leads respectively extending from said inner leads;

a first semiconductor chip having a polygonal flat shape, a back face of said first semiconductor chip mounted on a first face of said die pad of said lead frame;

a second semiconductor chip having a polygonal flat shape in which the number of the sides is the same as that of said first semiconductor chip, a back face of said semiconductor chip mounted on a second face of said die pad of said lead frame;

a plurality of bonding pads disposed at each of said sides of each of said respective main faces of said first and second semiconductor chips respectively; and bonding wires connecting said inner leads to said bonding pads;

said first and second semiconductor chips being disposed on said die pad so that projections lines of the corresponding sides of the polygons forming said first and second semiconductor chips formed on said die pad, intersect with each other obliquely, wherein said tips of said inner leads are located in the sides of a virtual polygon pattern, said sides of said virtual polygon pattern respectively facing to the sides of said semiconductor chips, the number of the inner leads of which tips are located in each of said sides of said virtual polygon pattern, is the same as the number of the bonding pads disposed at each of said sides of said semiconductor chips which respectively face to said sides of said virtual polygon pattern, the inner leads of which tips are located in each of said sides of said virtual polygon pattern, are connected to the bonding pads at each of said sides of one of said first and second semiconductor chips, and the inner leads of which tips are located in adjacent two sides of said virtual polygon pattern, are respectively connected to bonding pads of said first semiconductor chip and bonding pads of said semiconductor chip.

2. A semiconductor device according to claim 1, wherein said semiconductor chips have the same size, and said die pad has a contour which is substantially the same as the contour of a figure formed by overlapping two polygons each of which forms said flat shape of each of said semiconductor chips.

3. A semiconductor device according to claim 1, wherein said semiconductor chips have different sizes, and said die pad has a shape which is at least substantially the same as the shape of a polygon which forms said flat shape of the semiconductor chip whichever is the greater.

4. A semiconductor device according to claim 1, wherein each of the flat shapes of said semiconductor chips is quadrilateral.

5. A semiconductor device according to claim 4, wherein said lead frame has a quadrilateral outer frame member having four pieces which support the rear end portions of said outer leads, each of said semiconductor chips has a quadrilateral flat shape, said first semiconductor chip is located in a standard position where the sides of the quadrilateral forming said flat shape of said first semiconductor chip are respectively parallel to said four pieces of said outer frame member, and said second semiconductor chip is located in an inclined position where the sides of the quadrilateral forming said flat shape of said second semiconductor chip are respectively inclined at a predetermined angle with respect to said four pieces of said outer frame member.

6. A semiconductor device according to claim 5, wherein said semiconductor chips have the same size, and said die pad has a contour which is substantially the same as the contour of a figure formed by overlapping two polygons each of which forms said flat shape of each of said semiconductor chips.

7. A semiconductor device according to claim 6, wherein said lead frame comprises:

an intermediate frame member which connects the tips of said outer leads to one another and which has four pieces respectively parallel to said four pieces of said outer frame member; and support members extending from those apexes of the contour figure of said die pad corresponding to at least two opposite apexes of the quadrilateral which forms said second semiconductor chip, each of said support members being connected to a part of each of two pieces of said intermediate frame member.

8. A semiconductor device comprising:

a lead frame having a die pad, a plurality of inner leads having tips disposed in proximity to said die pad and which extend toward said die pad, outer leads respectively extending from said inner leads, and a quadrilateral outer frame member having four pieces which support the rear ends of said outer leads;

a first semiconductor chip defining a quadrilateral flat shape having four sides respectively parallel to said pieces of said outer frame member, a back face of said first semiconductor chip mounted on a first face of said die pad of said lead frame;

a second semiconductor chip defining a quadrilateral flat shape which has four sides inclined at a predetermined angle with respect to said pieces of said outer frame member, a back face of said second semiconductor chip mounted on a position adjacent to said first semiconductor chip on said first face of said die pad of said lead frame;

a third semiconductor chip defining a quadrilateral flat shape which has four sides inclined at a predetermined angle with respect to said pieces of said outer frame member, a back face of said third semiconductor chip mounted on a second face of said die pad of said lead frame at the position opposite to said first semiconductor chip through said die pad;

a fourth semiconductor chip defining a quadrilateral flat shape which has four sides respectively parallel to said pieces of said outer frame member, a back face of said fourth semiconductor chip mounted on said second face of said die pad of said lead frame at the position opposite to said second semiconductor chip through said die pad;

a plurality of bonding pads disposed at each of said sides of each respective main face of said first to fourth semiconductor chips respectively; and bonding wires connecting said inner leads and said bonding pads to each other.

9. A semiconductor device according to claim 8, wherein at least one of said inner leads has a rod-like member of which tip extends to the space between said inner leads and said die pad; and said rod-like member is connected to at least two bonding pads through bonding wires.

10. A semiconductor device comprising:

a lead frame having a die pad, a plurality of inner leads each having tips disposed in proximity to said die pad and which extend toward said die pad, and outer leads respectively extending from said inner leads;

a first semiconductor chip having a polygonal flat shape, a back face of said first semiconductor chip mounted on a first face of said die pad of said lead frame;

a second semiconductor chip having a polygonal flat shape in which the number of the sides is the same as that of said first semiconductor chip, a back face of said semiconductor chip mounted on a second face of said die pad of said lead frame;

a plurality of bonding pads disposed at each of said sides of each of said respective main faces of said first and second semiconductor chips respectively; and bonding wires connecting said inner leads to said bonding pads;

said first and second semiconductor chips being disposed on said die pad so that projections lines of the corresponding sides of the polygons forming said first and second semiconductor chips formed on said die pad, intersect with each other obliquely, wherein said lead frame has a lamination structure in which two lead frames having the same shape, are laminated to each other.

* * * * *